United States Patent [19]

Takahashi et al.

[11] Patent Number: 5,287,000

[45] Date of Patent: Feb. 15, 1994

[54] RESIN-ENCAPSULATED SEMICONDUCTOR MEMORY DEVICE USEFUL FOR SINGLE IN-LINE PACKAGES

[75] Inventors: Yasushi Takahashi, Tachikawa; Kazuyuki Miyazawa, Iruma; Hidetoshi Iwai, Ohme; Masaya Muranaka, Akishima; Yoshitaka Kinoshita, Kokubunji; Satoru Koshiba, Tokyo, all of Japan

[73] Assignees: Hitachi, Ltd., Tokyo; Hitachi VLSI Engineering Corp., Kodaira, both of Japan

[21] Appl. No.: 674,969

[22] Filed: Mar. 26, 1991

Related U.S. Application Data

[63] Continuation-in-part of Ser. No. 540,484, Jun. 19, 1990, abandoned, which is a continuation of Ser. No. 256,862, Oct. 12, 1988, Pat. No. 4,934,820, and a continuation of Ser. No. 531,313, May 31, 1990, abandoned.

[30] Foreign Application Priority Data

Oct. 20, 1987 [JP] Japan .................................. 62-264679
Jun. 5, 1989 [JP] Japan .................................... 1-143676

[51] Int. Cl.⁵ ..................... H01L 23/48; H01L 29/44; H01L 27/10; H02G 3/08
[52] U.S. Cl. .................................... 257/676; 257/692; 257/696; 257/773; 257/787; 174/52.4; 361/813; 365/51
[58] Field of Search .................. 357/45; 257/676, 692, 257/696, 773, 787; 174/52.4

[56] References Cited

U.S. PATENT DOCUMENTS

| 4,934,820 | 6/1990 | Takahashi et al. ...................... 357/90 |
| 5,097,440 | 3/1992 | Konishi et al. .......................... 357/45 |

FOREIGN PATENT DOCUMENTS

| 130798 | 1/1985 | European Pat. Off. .............. 357/45 |
| 60-9134 | 1/1985 | Japan ..................................... 357/70 |
| 61-218139 | 9/1986 | Japan ..................................... 357/70 |
| 62-21256 | 1/1987 | Japan ..................................... 357/70 |

*Primary Examiner*—Rolf Hille
*Assistant Examiner*—Robert Limanek
*Attorney, Agent, or Firm*—Antonelli, Terry, Stout & Kraus

[57] ABSTRACT

According to one aspect of the present invention, a semiconductor chip, which can be mounted in a zigzag in-line type package (ZIP) partially using a tabless lead frame, includes bonding pads arranged on the chip so that the chip can be applied also to other different types of packages. These different types of packages include a small out-line J-bent type package (SOJ) which uses a lead frame with tab, and a dual in-line type package (DIP) which uses a tabless lead frame. Further, a plurality of bonding pad pairs are provided amongst the bonding pads on the chip, each pad of such bonding pad pairs having the same function as the other pad associated therewith thereby duplicating a common function in different bonding pads on the semiconductor chip so as to make the semiconductor chip compatible with a variety of or different types of packages. In accordance with another aspect of the invention, a resin-encapsulated semiconductor device of the ZIP structure is provided in which a semiconductor pellet having a plurality of external terminals disposed on a device-forming surface along each side of the planar shape is encapsulated with a resin, wherein inner leads for signals connected electrically with external terminals, disposed opposing to the surface of the resin-encapsulated portion disposed with outer leads and disposed along the most remote side of the semiconductor pellet, are arranged so as to overlap the semiconductor pellet.

11 Claims, 17 Drawing Sheets

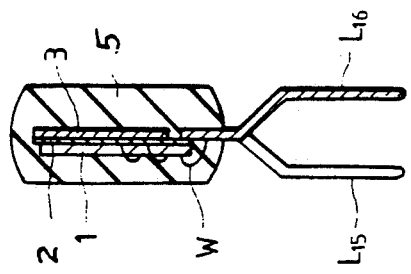
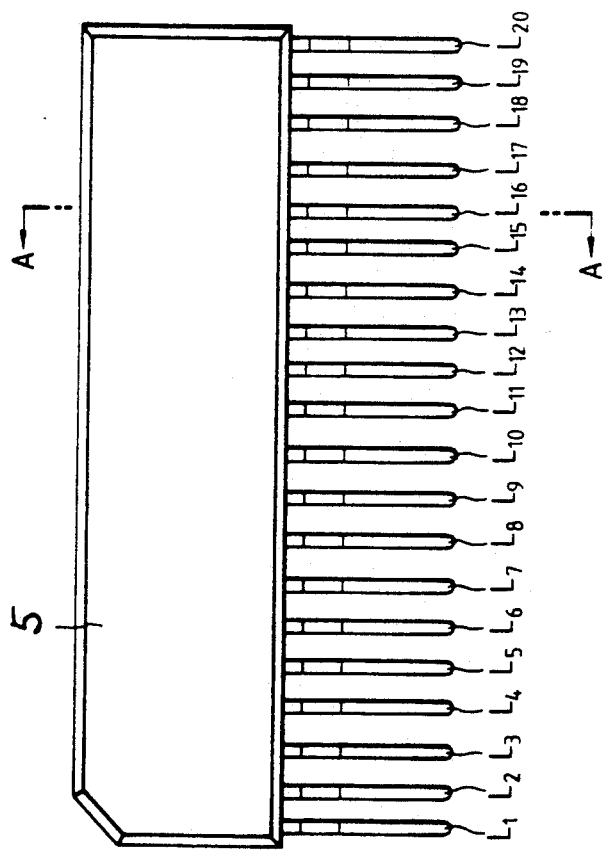
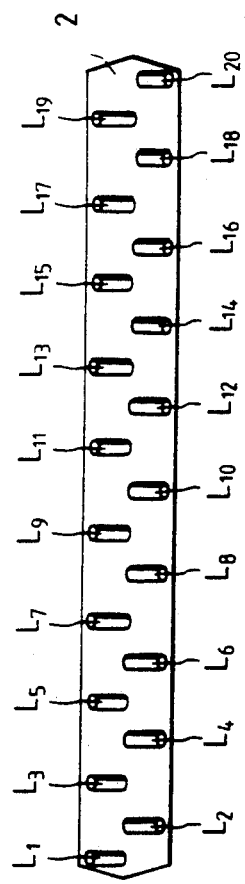

RESIN-ENCAPSULATED SEMICONDUCTOR MEMORY DEVICE USEFUL FOR SINGLE IN-LINE PACKAGES

This invention is a continuation-in-part application of application Ser. No. 540,484 filed Jun. 19, 1990, now abandoned which is a continuation application of application Ser. No. 256,862 filed Oct. 12, 1988, now U.S. Pat. No. 4,934,820, and application Ser. No. 531,313 filed May 31, 1990 now abandoned.

BACKGROUND OF THE INVENTION

The present invention relates to a semiconductor device, and more particularly, to a technique which effectively allows application of a semiconductor chip (pellet) in different kinds of packages. It also relates to a technique effective for the formation of a resin-encapsulated semiconductor device employing a single in-line package structure.

Dual in-line type packages (DIP type packages) have heretofore been mainly used for RAMs up to a 256k-bit dynamic RAM. However, with higher integration, a package which permits a high density mounting has been desired. Consequently, particularly in dynamic RAMs of 1M bits or more, there is an increasing demand for packages other than DIP type packages, such as small out-line type (SOJ type) packages and zigzag in-line type (ZIP type packages).

Typically, a resin-encapsulated semiconductor device using a ZIP (zigzag in-line package) structure is a resin-encapsulated semiconductor device of high mounting density. In the resin-encapsulated semiconductor device, a semiconductor pellet mounted on the surface of a tab is tightly encapsulated with a resin. External terminals of the semiconductor pellet (i.e., the bonding pads) are connected electrically by way of bonding wires to the ends of inner leads on one side. The ends on the other sides of the inner leads are integrally constituted with outer leads. A plurality of these outer leads (external pins) are disposed along one surface of the resin-encapsulated portion in a zigzag form.

A resin-encapsulated semiconductor device using such a ZIP structure can be mounted on a mounting substrate by way of outer leads thereof. In the resin-encapsulated semiconductor device, the device-forming surfaces of the semiconductor pellet, inner leads and outer leads are respectively arranged substantially vertically to the mounting substrate. That is, the resin-encapsulated semiconductor device of the ZIP structure occupies a smaller area and has a higher mounting density on the mounting substrate as compared with DIP (dual in-line package), SOP (small out-line package) respectively.

SUMMARY OF THE INVENTION

From their studies, the inventors came to realize that it is difficult to use a single type of semiconductor chip in a variety of different types of packages because of an increase in size of semiconductor chips with which occurs an increase in the capacity of dynamic RAMs formed on such chips. More particularly, as the chip size increase, the spacing between the side end of a package and a tab as a chip mounting portion becomes narrow. Therefore, when it is sought to use the chip for a different type of package, there arises the problem of a narrower spacing being available between the side end of the package and a tab. As a result, the inner leads contained in the resin which forms the package must be made shorter, since, otherwise, it will become impossible to completely receive the leads in the package.

In view of the above problem, the present inventors have developed a technique permitting a single semiconductor chip to be applicable to different types of packages. The following is a brief description of this aspect of the present invention.

To begin with, bonding pads are disposed on a semiconductor chip so as to be applicable to different kinds of packages such as ZIP type package, SOJ type package and DIP type package. Further, lead frames are used corresponding, respectively, to various packages. Due to these arrangements, it is possible for a single semiconductor chip to be applicable to or compatible with different kinds of packages by selecting bonding pads and a lead frame according to the kind of a package used.

Moreover, it is also possible to obtain a semiconductor chip applicable to various kinds of packages by using conventional lead frames without changing the wiring other than the wiring for effecting the connection of the leads with internal circuitry of the chip or bonding pads, this being accomplished without changing the pre-existing arrangement of the bonding pads.

In accordance with another aspect of the present invention, a resin-encapsulated semiconductor device with a ZIP structure is provided for mounting a DRAM having a large capacity such as 1M bit on a semiconductor pellet. A memory cell in such a DRAM is formed with a series circuit comprised of a memory cell selecting MISFET and an information storing capacitive element. The peripheral circuit of the DRAM comprises a complimentary MISFET structure and a bipolar transistor, respectively. The semiconductor pellet has a planar rectangular shape, and, as noted above, the planar size of the semiconductor pellet is increased along with the increase of DRAM capacity. Meanwhile, the resin-encapsulated semiconductor device using ZIP structure is typically limited to be of a 400 mil size based on general industry standards.

An address non-multi system is typically employed for the DRAM with an aim of increasing the speed for access time. By the employment of the address non-multi system, the number of outer leads for address signals and the number of external terminals for address signals disposed on the device-forming surface of the semiconductor pellet are increased to twice those of the address multi system. For instance, at least 28 external terminals are required for the semiconductor pellet, including, for example, external terminals for an address signal, external terminals for a clock signal, external terminals for data signals and external terminals for power supply. Accordingly, the external terminals are disposed in the peripheral region along each of the sides (i.e. four sides) of a rectangular shape of the semiconductor pellet, as well as at the central portion of the longer side of the semiconductor pellet.

The reason for disposing the external terminals along each side of the rectangular semiconductor pellet is explained below. In a DRAM, row address decoder circuits for selecting word lines are disposed side by side in two rows at the central portion along the longitudinal side of the rectangular semiconductor pellet, and peripheral circuits are disposed between the two rows of the row address decoder circuits. Further, eight memory mats are disposed in two groups of four with the central peripheral circuit and the row address decoder circuits disposed between the respective two groups. For increasing the speed of the access time, it is necessary that the bonding pads for inputting the address signal for selecting the word lines are disposed near the row address decoder circuit, in order to reduce the wiring resistance from the bonding pad to the row address decoder circuit. That is, if the bonding pad for an address signal is disposed between the row address decoder circuits arranged in two rows, the wiring resistance from the bonding pad for the address signal to the row address decoder circuit can be reduced. For such a reason, the bonding pads for inputting the address signals for selecting the word lines are disposed at the central portions of two longer sides of the rectangular semiconductor pellet in the DRAM.

When the semiconductor pellet is encapsulated with a resin, the inner leads have to be extended around the outside of the semiconductor pellet for electrical connection with the outer terminals opposing to the surface of the resin-encapsulated portion arranged with the outer leads and arranged along the most remote side of the semiconductor pellet. As described above, since the size of the semiconductor pellet is increased and the size of the resin-encapsulated semiconductor device of ZIP structure is restricted, there is almost no room in the resin-encapsulated portion for leading around the inner leads. Accordingly, it is almost impossible for all of the inner leads to extend around the outside of the semiconductor pellet. Further, if they are extended, the size, in particular, the size along the height of the resin-encapsulated portion, is increased. This creates a problem that the size of the resin-encapsulated semiconductor device employing such a ZIP structure is also increased.

Further, an increase in the size of the resin-encapsulated semiconductor device employing such a ZIP structure results in a problem that it reduces the three-dimensional mounting density of a memory board, when the device is mounted thereto.

Therefore, an object in accordance with this aspect of the present invention is to provide a technique capable of reducing the size of a resin-encapsulated semiconductor device employing a single in-line package structure.

Another object of this aspect of the present invention is to provide a technique capable of reducing the size as described above and also improving the yield in the resin-encapsulated semiconductor device.

A further object of this aspect of the present invention is to provide a technique capable of improving the electric reliability of a resin-encapsulated semiconductor device.

A still further object of this aspect of the present invention is to provide a technique capable of increasing the operation speed of a resin-encapsulated semiconductor device.

Yet another object of this aspect of the present invention is to provide a technique capable of improving the heat dissipating efficiency of a resin-encapsulated semiconductor device.

These and other objects, as well as other novel features of the present invention will become apparent by reading the following descriptions of the specification in conjunction with the accompanying drawings.

The outline for typical inventions among those disclosed in the present patent specification regarding this aspect of the present invention will be briefly described below.

(1) A resin-encapsulated semiconductor device of ZIP structure in which a semiconductor pellet having a plurality of external terminals disposed on a device-forming surface along each side of a planar rectangular shape is encapsulated with a resin, wherein inner leads for signals connected electrically to external terminals opposing to the surface of the resin-encapsulated portion disposed with the outer leads and disposed along the most remote side of the semiconductor pellet are disposed so as to overlap with the semiconductor pellet.

(2) The widths of the inner leads for signals disposed so as to overlap with the semiconductor pellet are made smaller than the widths of the other inner leads for signals which are extended around the periphery of the semiconductor pellet.

(3) The widths of inner leads for power supply disposed so as to overlap with the semiconductor pellet are made larger than the widths of the inner leads for signals disposed so as to overlap with the semiconductor pellet.

According to the means (1) above, since the size of the resin-encapsulated portion can be reduced by extending around the inner leads for signals electrically connected with the external terminals disposed along the most remote side of the semiconductor pellet within the occupying area of the semiconductor pellet, the size of the resin-encapsulated semiconductor device of ZIP structure can be reduced.

Further, since the length of the inner leads for signals disposed so as to overlap with the semiconductor pellet can be shortened as compared with the case of extending them around the outer side of the semiconductor pellet and the inductance of the inner leads for signal can be reduced, it is possible to reduce the signal noise. This prevents erroneous operation of circuits mounted on the semiconductor pellet and improves the reliability of the resin-encapsulated semiconductor device of ZIP structure. Further, size reduction in the resin-encapsulated type semiconductor device of ZIP structure enables increasing the three-dimensional mounting density on the memory board.

According to the means (2) above, since the parasitic capacitance formed between the inner leads for signals disposed so as to overlap with the semiconductor pellet and the semiconductor pellet can be reduced, thereby increasing the transmission speed of signals along these inner leads, the operation speed of the resin-encapsulated semiconductor device of ZIP structure can be increased.

According to the means (3) described above, since the parasitic capacitance between the inner leads for power supply and the semiconductor pellet can be increased, and the noises from the power supply used for the circuit mounted on the semiconductor pellet can be decreased by the coupling effect, the electric reliability of the resin-encapsulated semiconductor device of ZIP structure can be improved. Further, since the inductance of the inner leads for power supply can be reduced to thereby reduce the power supply noise, it is possible to improve the electrical reliability of the resin-encapsulated semiconductor device of ZIP structure.

BRIEF DESCRIPTION OF THE DRAWINGS

FIG. 3 is a side view showing an appearance of a ZIP type package of FIG. 1;

FIG. 4 is a bottom view of the ZIP type package shown in FIG. 3;

FIG. 5 is a sectional view taken along line A—A of FIG. 3;

DESCRIPTION OF THE PREFERRED EMBODIMENTS

Figure 1:
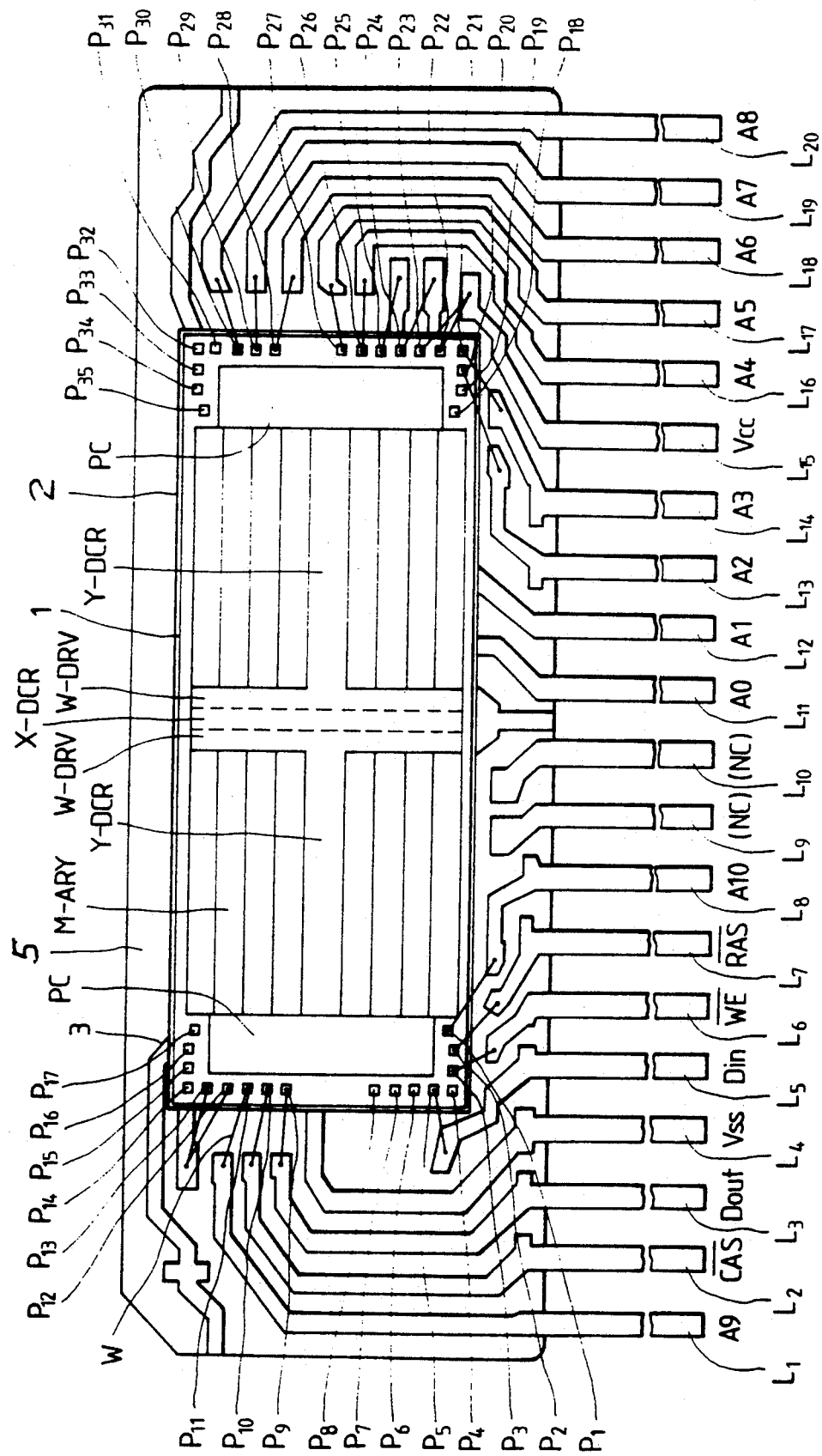
FIG. 1 is a side view showing an internal structure of a ZIP type package according to Embodiment I of the present invention.

Embodiments of the present invention will be described below specifically with reference to the accompanying drawings. In all of the drawings illustrating the embodiments, the portions having the same functions are indicated by the same reference numerals. Therefore, repeated explanations thereof will be omitted.

Embodiment I

Figure 2:
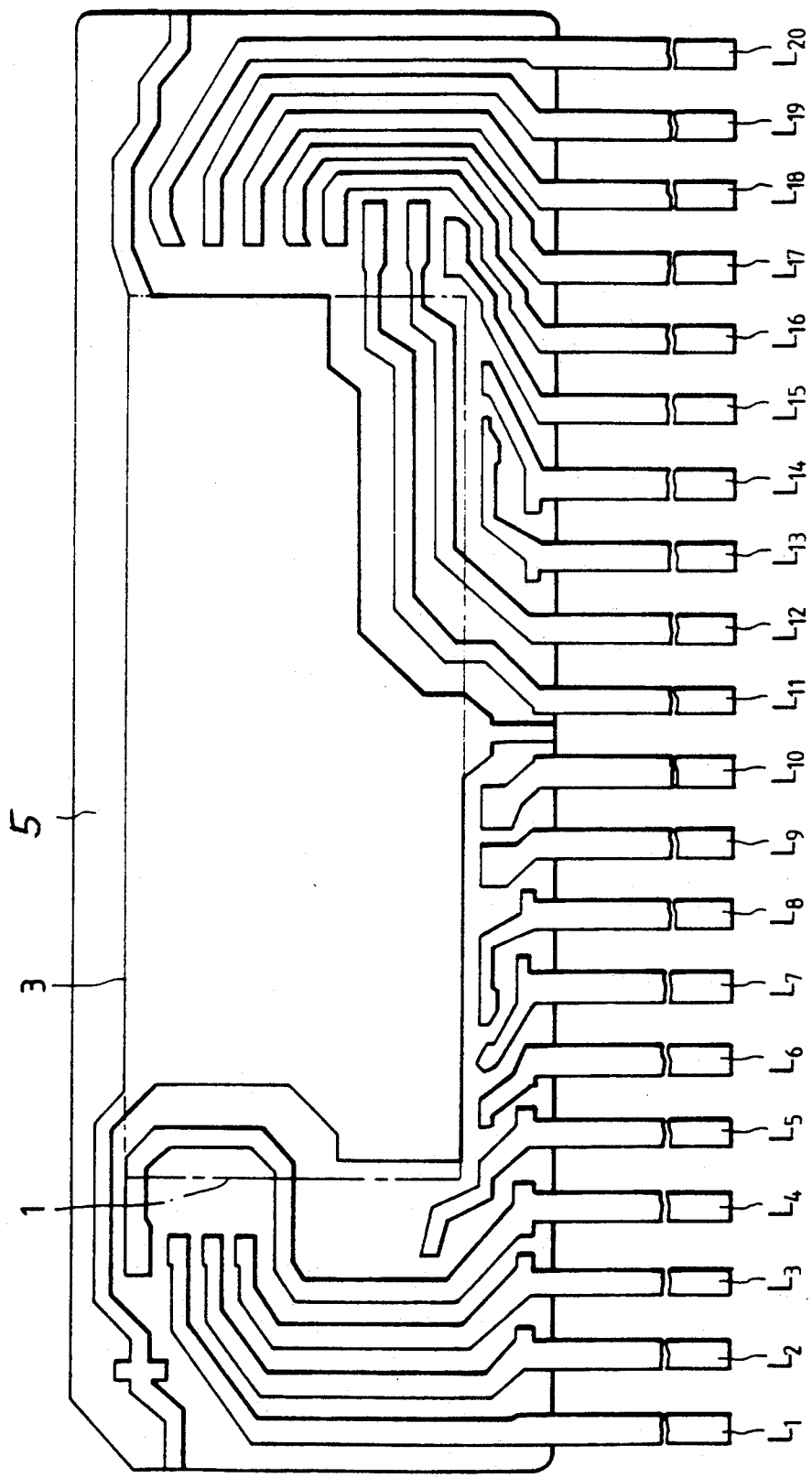
FIG. 2 is a side view showing the shape of leads in the ZIP type package of FIG. 1.

FIG. 1 is a side view showing an internal structure of a ZIP type package according to Embodiment I of the present invention; FIG. 2 is a side view showing the shape of leads used in the ZIP type package of FIG. 1; FIG. 3 is a side view showing an appearance of the ZIP type package of FIG. 1; FIG. 4 is a bottom view of the ZIP type package shown in FIG. 3; and FIG. 5 is a sectional view taken along line A—A of FIG. 3.

As shown in FIGS. 1 to 5, in the ZIP type package according to Embodiment I, a semiconductor chip 1 such as, for example, a silicon chip, which constitutes a dynamic RAM of say 4M bits (e.g. $4M \times 1$ bit construction) is sealed by resin 5. The size of this ZIP type package is 350 mil, for example. The reference marks $L_1$ to $L_{20}$ denote leads. In this embodiment, the number of those leads is twenty; that is, the ZIP type package according to Embodiment I has 20 pins (noting, however, that the number of pins actually used is 18, as will be described later). Of the leads $L_1$ to $L_{20}$, the leads $L_4$, $L_{11}$ and $L_{12}$ are distributed along the underside of the semiconductor chip 1. Thus, the lower-side area of the chip 1 is used for the wiring of the leads $L_4$, $L_{11}$ and $L_{12}$. Numeral 3 denotes a support plate for supporting the semiconductor chip 1. The chip 1 is supported in the greater part thereof by the support plate 3, but partially it is supported by the leads $L_4$, $L_{11}$ and $L_{12}$. That is, the semiconductor chip 1 is supported by both the support plate 3 and the leads $L_4$, $L_{11}$ and $L_{12}$. Thus, the ZIP type semiconductor device according to Embodiment I has been formed partially using a tabless lead frame. Further, by using the under-side area of the semiconductor chip 1 for the wiring of some leads it is made possible to reduce the package size as compared with the case where leads are disposed around a semiconductor chip using a tab.

Where the semiconductor chip 1 is supported by the support plate 3 and the leads $L_4$, $L_{11}$ and $L_{12}$, the chip 1 is mounted through an electrical insulator, for example, a polyimide-based resin sheet 2 (FIG. 5), whereby it is possible to attain electrical insulation between the support plate 3 and the leads $L_4$, $L_{11}$ and $L_{12}$ and also electrical insulation among the leads $L_4$, $L_{11}$ and $L_{12}$.

As shown in FIG. 1, the semiconductor chip 1 is provided with four memory cell arrays M-ARY, X decoder X-DCR, Y decoder Y-DCR, word line driver W-DRV and peripheral circuitry PC. The memory cell arrays M-ARY are each divided into four partitions each 256 k bits. The semiconductor chip 1 is provided with bonding pads $P_1$ to $P_{35}$ at short-side end portions thereof. Of these bonding pads $P_1$ to $P_{35}$, the bonding pads $P_1$ to $P_3$, $P_5$, $P_9$ to $P_{13}$ and $P_{20}$ to $P_{30}$ and the leads $L_1$ to $L_8$ and $L_{11}$ to $L_{20}$ are bonded through wires W. Thus, the semiconductor chip 1 is provided with bonding pads not actually used which are $P_4$, $P_6$ to $P_8$, $P_{14}$ to $P_{19}$ and $P_{31}$ to $P_{35}$. These bonding pads are to be used when an SOJ type package or a DIP type package is used in place of the ZIP type package. The bonding pads $P_4$, $P_6$ to $P_8$, $P_{14}$ to $P_{19}$ and $P_{31}$ to $P_{35}$ which are not actually used in the ZIP type package are electrically connected to the foregoing lead in the same package; that is, they have the same function as that of the bonding pads $P_1$ to $P_3$, $P_5$, $P_9$ to $P_{13}$ and $P_{20}$ to $P_{30}$ which are actually being used. Thus, the bonding pads $P_1$ to $P_{35}$ are provided on the semiconductor chip 1 so as to be applicable to packages of different types from the ZIP type package. Consequently, using the same semiconductor chip 1, the present invention is applicable to other packages than the ZIP type package. That is, when there is a demand for using a package other than the ZIP type package, the demand can be met by a mere change to the package to be used without redesigning the semiconductor chip 1.

The leads (pins) $L_1$ to $L_{20}$ function as shown in FIG. 1. In the same figure, A0–A10 represent address signals, Vcc represents a supply potential, Vss an earth potential, $\overline{CAS}$ a column address strobe signal, $\overline{RAS}$ a row address strobe signal, $\overline{WE}$ a write enable signal, Dout a data output, and Din a data input. The leads $L_9$ and $L_{10}$ are not actually used, which are indicated by NC. The lead $L_{15}$ of Vcc and the bonding pads $P_{22}$ and $P_{23}$ are bonded together through two wires W, and the lead $L_4$ of Vss and the bonding pads $P_{12}$ and $P_{13}$ are bonded through two wires W. This is for reducing the power source impedance.

The following is an explanation of a semiconductor device assembling process using the ZIP type package of Embodiment I.

In the semiconductor device with the semiconductor chip of 4MDRAM mounted thereon according to Embodiment I, as shown in FIGS. 1 to 5, the insulating sheet 2 is bonded onto the support plate 3 and the inner lead portions of the leads $L_4$, $L_{11}$ and $L_{12}$, then the semiconductor chip 1 of 4MDRAM is mounted on the sheet 2. The foregoing lead frame, having such a shape as shown in FIG. 2, is formed by a copper alloy or an iron-nickel alloy. The insulating sheet 2 and the semiconductor chip 1 are mounted through an adhesive (not shown) or by pressure-bonding.

Next, the bonding portions of the leads $L_1$ to $L_8$ and $L_{11}$ to $L_{20}$ and the bonding pads $P_1$ to $P_3$, $P_5$, $P_9$ to $P_{13}$ and $P_{20}$ to $P_{30}$ are electrically connected together through bonding wires W which are gold (Au) wires, for example. The wire bonding is carried out by a wedge ball bonding method.

After the wire bonding is over, a resin-sealed type semiconductor device is completed through a conventional resin sealing step. For example, an epoxy resin is used as the sealing resin.

Embodiment II

Figure 6:
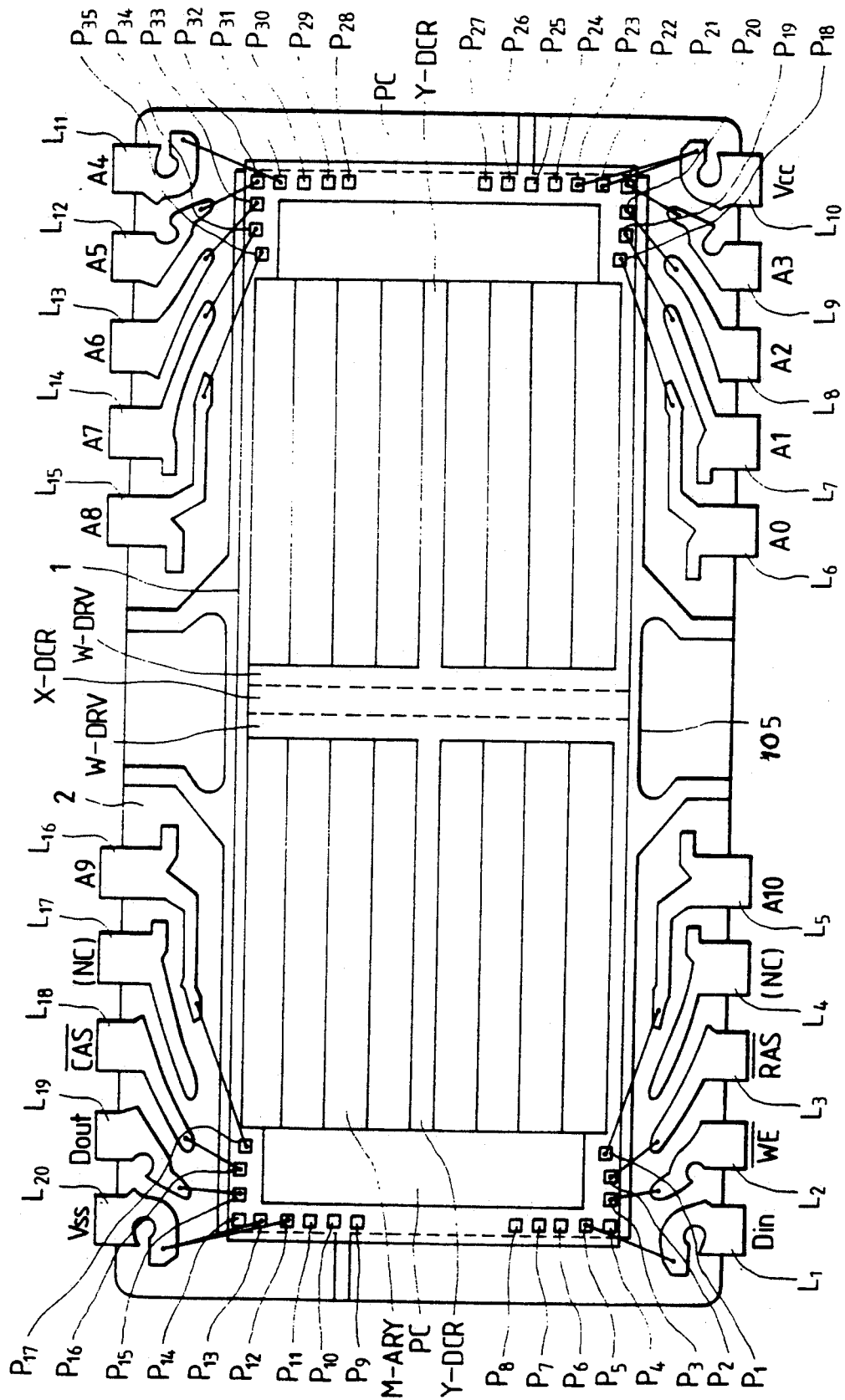
FIG. 6 is a plan view showing an internal structure of an SOJ type package according to Embodiment II of the present invention.
Figure 7:
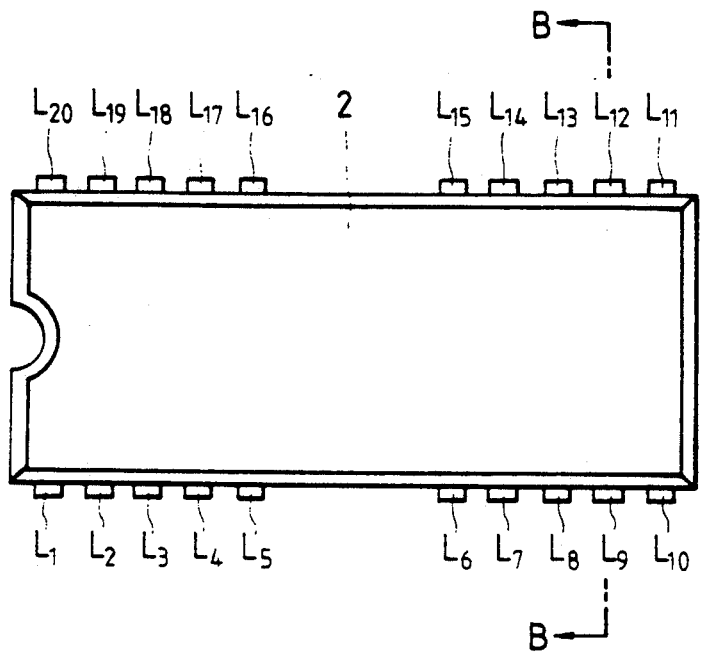
FIG. 7 is a plan view showing an appearance of the SOJ type package of FIG. 6.
Figure 8:
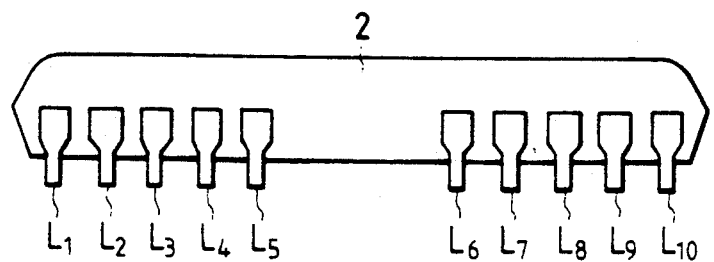
FIG. 8 is a side view of the SOJ type package shown in FIG. 7.

FIG. 6 is a plan view showing an internal structure of an SOJ type package according to Embodiment II of the present invention; FIG. 7 is a plan view showing an appearance of the SOJ type package of FIG. 6; FIG. 8 is a side view of the SOJ type package shown in FIG. 7; and FIG. 9 is a sectional view taken along line B—B of the SOJ type package shown in FIG. 7.

Figure 9:
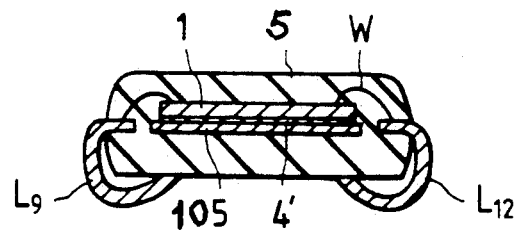
FIG. 9 is a sectional view taken along line B—B of the SOJ type package shown in FIG. 7.

In the SOJ type package according to Embodiment II, as shown in FIGS. 6 to 9, a semiconductor chip 1 similar to that used in Embodiment I is sealed by resin 5. The size of this SOJ type package is 350 mil, for example. Unlike Embodiment I, leads $L_1$ to $L_{20}$ have been formed using a lead frame with tab. The semiconductor chip 1 is supported by only a tab 105 which is of about the same shape as the chip. The lead frame with tab was used so that the same semiconductor chip as that used in the ZIP type package of Embodiment I could be used also in the SOJ type package. Since the semiconductor chip 1 is supported by only the tab 105, the semiconductor chip 1 is mounted directly on the tab 105 rather than through an electrical insulation such as the polyimide resin sheet 2 used in Embodiment I. As shown in FIG. 9, the semiconductor chip 1 is attached to the tab through an adhesive 4'.

In this Embodiment II, of the bonding pads $P_1$ to $P_{35}$ provided on the semiconductor chip 1, it is $P_1$ to $P_3$, $P_5$, $P_{12}$, $P_{13}$, $P_{15}$ to $P_{23}$ and $P_{31}$ to $P_{35}$ that are actually being used. The bonding pads $P_1$ to $P_3$, $P_5$, $P_{12}$, $P_{13}$, $P_{15}$ to $P_{23}$ and $P_{31}$ to $P_{35}$ and leads $L_1$ to $L_3$, $L_5$ to $L_{16}$ and $L_{18}$ to $L_{20}$ are bonded through wires W. The leads $L_4$ and $L_{17}$ are not used in this Embodiment II.

The semiconductor chip 1 used in this Embodiment II is the same as that used in the ZIP type package of Embodiment I and is formed with the same circuitry as that in Embodiment I. The bonding pads used here are $P_1$ to $P_3$, $P_5$, $P_{12}$, $P_{13}$, $P_{15}$ to $P_{22}$ and $P_{31}$ to $P_{35}$. These bonding pads have been preformed on the semiconductor chip for the ZIP type package of Embodiment I, having the same function as that of the bonding pads used in the ZIP type package. The bonding pads being used are those which correspond to the lead frame for the SOJ type package.

Thus, according to this Embodiment II, out of the bonding pads $P_1$ to $P_{35}$ provided on the semiconductor chip 1 for the ZIP type package, those prepared in advance for the SOJ type package are used, whereby the SOJ type package incorporating the semiconductor chip 1 can be obtained easily without requiring the redesigning of the chip 1.

The following description is now provided with respect to a semiconductor device assembling process using the SOJ type package of Embodiment II.

As shown in FIGS. 6 to 9, the semiconductor chip is mounted on the tab 105 through the adhesive 4' which is an electroconductive material such as silver (Ag) paste, for example. The foregoing lead frame is formed by a copper alloy or an iron-nickel alloy.

Then, the bonding portions of the leads $L_1$ to $L_3$, $L_5$ to $L_{16}$ and $L_{18}$ to $L_{20}$ and the bonding pads $P_1$ to $P_3$, $P_5$, $P_{12}$, $P_{13}$, $P_{15}$ to $P_{23}$ and $P_{31}$ to $P_{35}$ on the semiconductor chip are electrically connected through bonding wires W. The bonding is carried out using, for example, gold (Au) wires according to a wedge ball method.

After the wire bonding is over, leads are formed through a conventional resin sealing step, whereby a semiconductor device for an SOJ type package is completed.

Embodiment III

Figure 10:
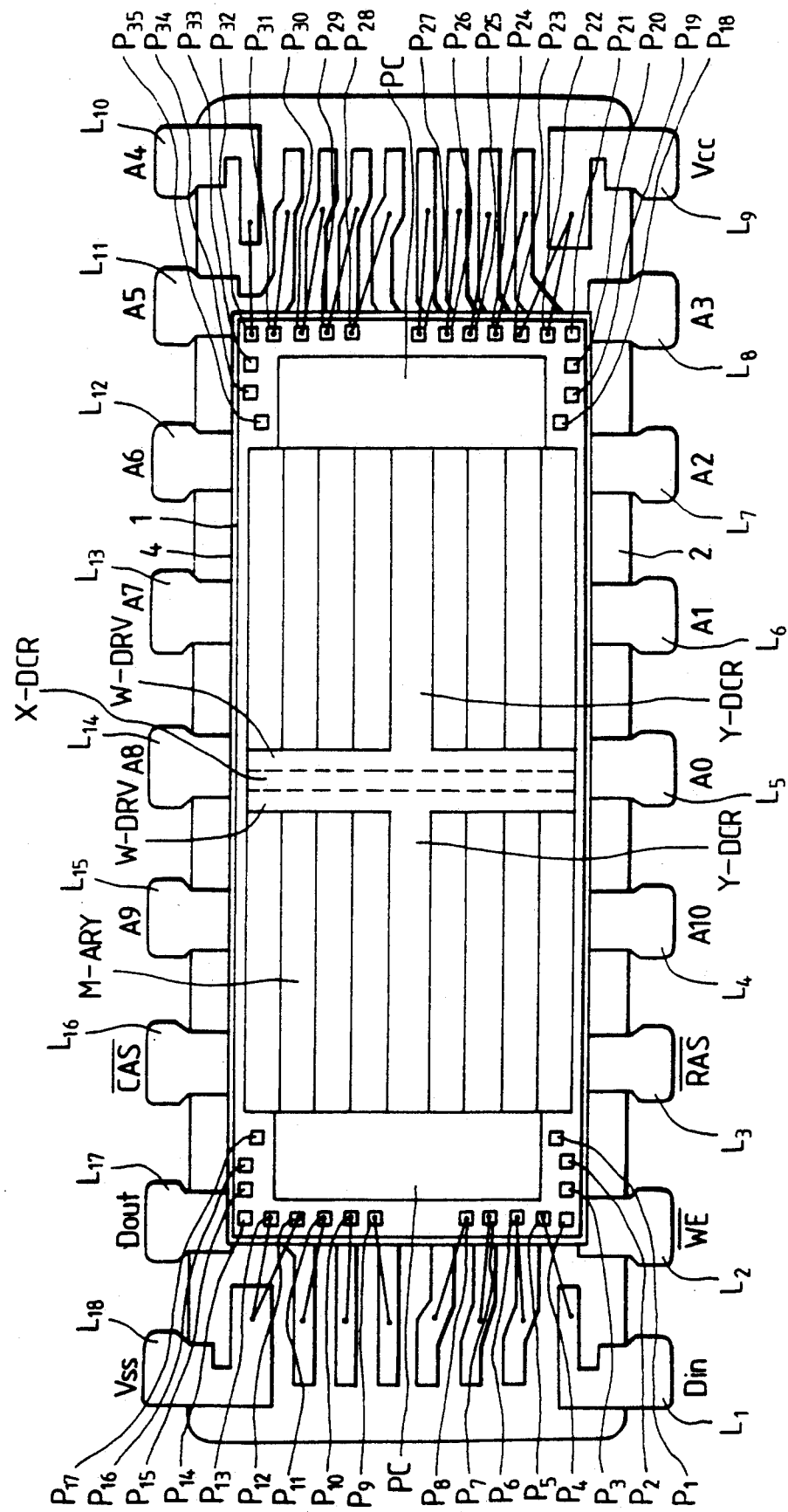
FIG. 10 is a plan view showing an internal structure of a DIP type package according to Embodiment III of the present invention.
Figure 11:
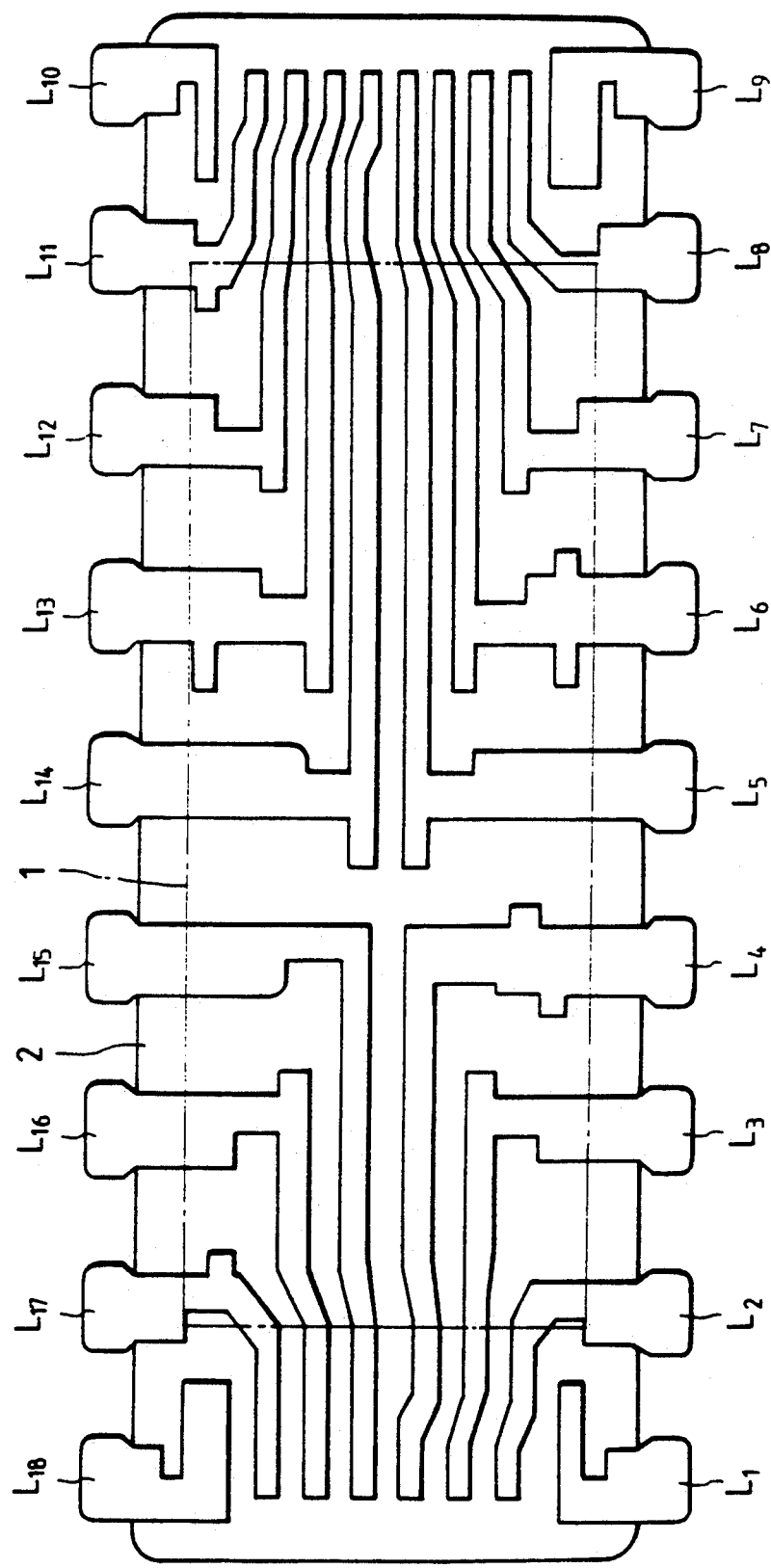
FIG. 11 is a plan view showing leads used in the DIP type package of FIG. 10.
Figure 12:
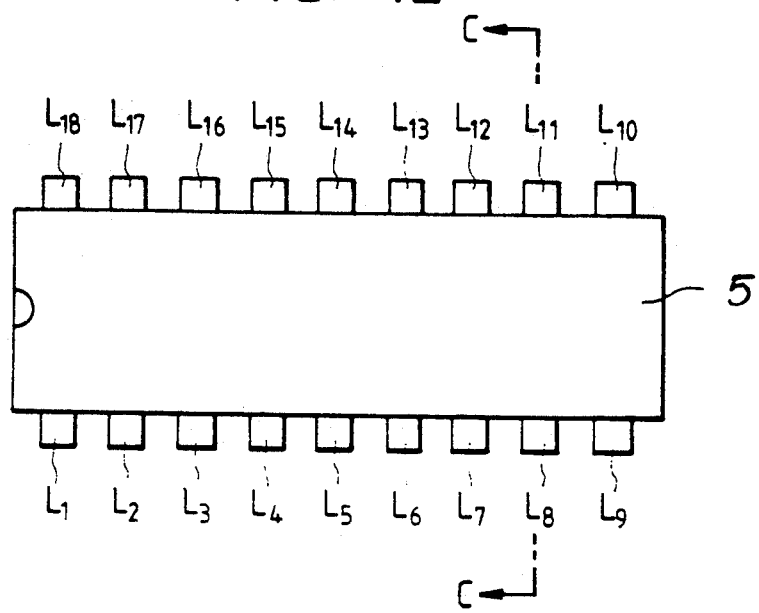
FIG. 12 is a plan view showing an appearance of the DIP type package of FIG. 10.
Figure 13:
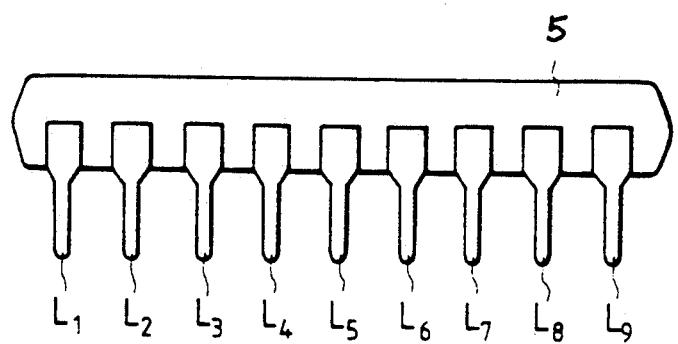
FIG. 13 is a side view of the DIP type package shown in FIG. 12.
Figure 14:
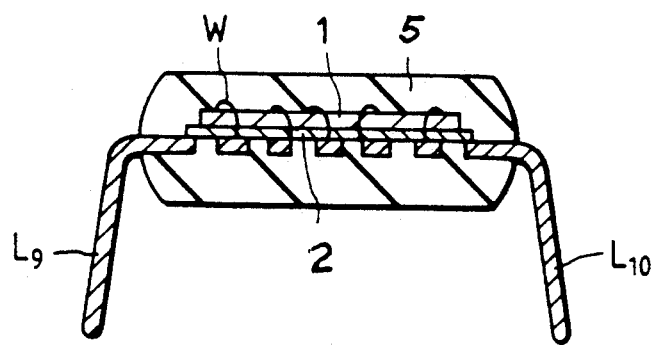
FIG. 14 is a sectional view taken along line C—C of the DIP type package shown in FIG. 12.

FIG. 10 is a plan view showing an internal structure of a DIP type package according to Embodiment III of the present invention; FIG. 11 is a plan view showing leads used in the DIP type package of FIG. 10; FIG. 12 is a plan view showing an appearance of the DIP type package of FIG. 10; FIG. 13 is a side view of the DIP type package shown in FIG. 12; and FIG. 14 is a sectional view taken along line C—C of the DIP type package shown in FIG. 12.

In the DIP type package according to Embodiment III, as shown in FIGS. 10 to 14, a semiconductor chip 1 similar to that of Embodiment I is sealed by resin 5. The size of this DIP type package is 300 mil, for example. Leads $L_1$ to $L_{18}$ have been formed using a tabless lead frame in the same manner as in Embodiment I, which lead frame according to the present embodiment is a tabless lead frame for DIP type package. In this Embodiment III, unlike Embodiments I and II, the support plate 3 or the tab 105 is not provided, and the semiconductor chip 1 is supported by the leads $L_2$ to $L_8$ and $L_{11}$ to $L_{17}$ through sheet 4. The whole of the under-side area of the chip 1 is used for the wiring of the leads $L_1$ to $L_{18}$.

Of the bonding pads $P_1$ to $P_{35}$ provided on the semiconductor chip 1, it is $P_5$ to $P_{13}$ and $P_{22}$ to $P_{32}$ that are actually used. These bonding pads $P_5$ to $P_{13}$ and $P_{22}$ to $P_{32}$ and the leads $L_1$ to $L_{18}$ are bonded through wires W.

In this Embodiment III, in order to attain satisfactory bonding with the leads, it is necessary that the function of the bonding pads $P_9$, $P_{11}$ and $P_{24}$ to $P_{32}$ be changed from that in Embodiments I and II. This functional change can be effected by changing the wiring of the final aluminum film used for the connection of the semiconductor chip 1 and the bonding pads into a wiring different from that used in the semiconductor chips for the ZIP and SOJ type packages. That is, only the function of the bonding pads is changed while their positions are kept intact. In comparison between FIGS. 1 and 10, the change in function from the bonding pads for the ZIP type package to the bonding pads for the DIP type package is performed specifically in the following manner: A0: from $P_{25}$ to $P_{27}$, A1: from $P_{24}$ to $P_{26}$, A2: from $P_{20}$ to $P_{25}$, A3: from $P_{21}$ to $P_{24}$, A4: from $P_{26}$ to $P_{32}$, A5: from $P_{27}$ to $P_{31}$, A6: from $P_{28}$ to $P_{30}$, A8: from $P_{30}$ to $P_{28}$, A9: from $P_{11}$ to $P_9$, A10: from $P_1$ to $P_8$, Dout: from $P_9$ to $P_{11}$, $\overline{WE}$: from $P_3$ to $P_6$, $\overline{RAS}$: from $P_2$ to $P_7$.

According to this Embodiment III, as can be seen from the above, by using those bonding pads which have been prepared in advance for the DIP type package out of the bonding pads $P_1$ to $P_{35}$, it is possible to easily obtain a DIP type package incorporating the semiconductor chip 1 through only the change of the aluminum wiring without redesigning the other portions of the chip 1.

Moreover, the DIP type package can be obtained without changing the lead frame and without changing the internal circuitry, other than the application of the final aluminum film wiring for connection to the pre-existing arrangement of the bonding pads.

Further, the use of a tabless lead frame permits reduction of the package size.

The assembly of the DIP package semiconductor device of Embodiment III is performed in the following manner as shown in FIGS. 10 to 14. The semiconductor chip 1 is mounted on the inner lead portions of the tabless lead frame through an insulating sheet, and, using the same steps as in Embodiment I, there is completed the DIP package semiconductor device. In this case, the leads $L_1$ to $L_{18}$ and the bonding pads $P_5$ to $P_{13}$ and $P_{22}$ to $P_{32}$ are electrically connected through bonding wires W. The function of the bonding pads is changed by changing only the aluminum wiring according to a master slice method in corresponding relation to the tabless lead frame.

Although the present invention has been described above in conjunction with specific embodiments thereof, it goes without saying that the invention is not limited to those embodiments and that various modifications may be made in the range not departing from the spirit and scope of the invention.

For example, the shape of the leads $L_1$ to $L_{20}$ may be changed where required. The 4M-bit dynamic RAM constituted by the semiconductor chip 1 may be of a 4M×1-bit construction. Not only the present invention is applicable to other semiconductor integrated circuit devices than dynamic RAMs, such as static RAMs, for example, but also it is possible to use other packages than the foregoing SOJ and DIP type packages, as packages of a different type from the ZIP type package. Thus, the same semiconductor chip is applicable to different types of packages.

Additional Embodiments

Other preferred embodiments of applying the present invention to a resin-encapsulated semiconductor device employing ZIP structure will now be discussed.

Figure 15:
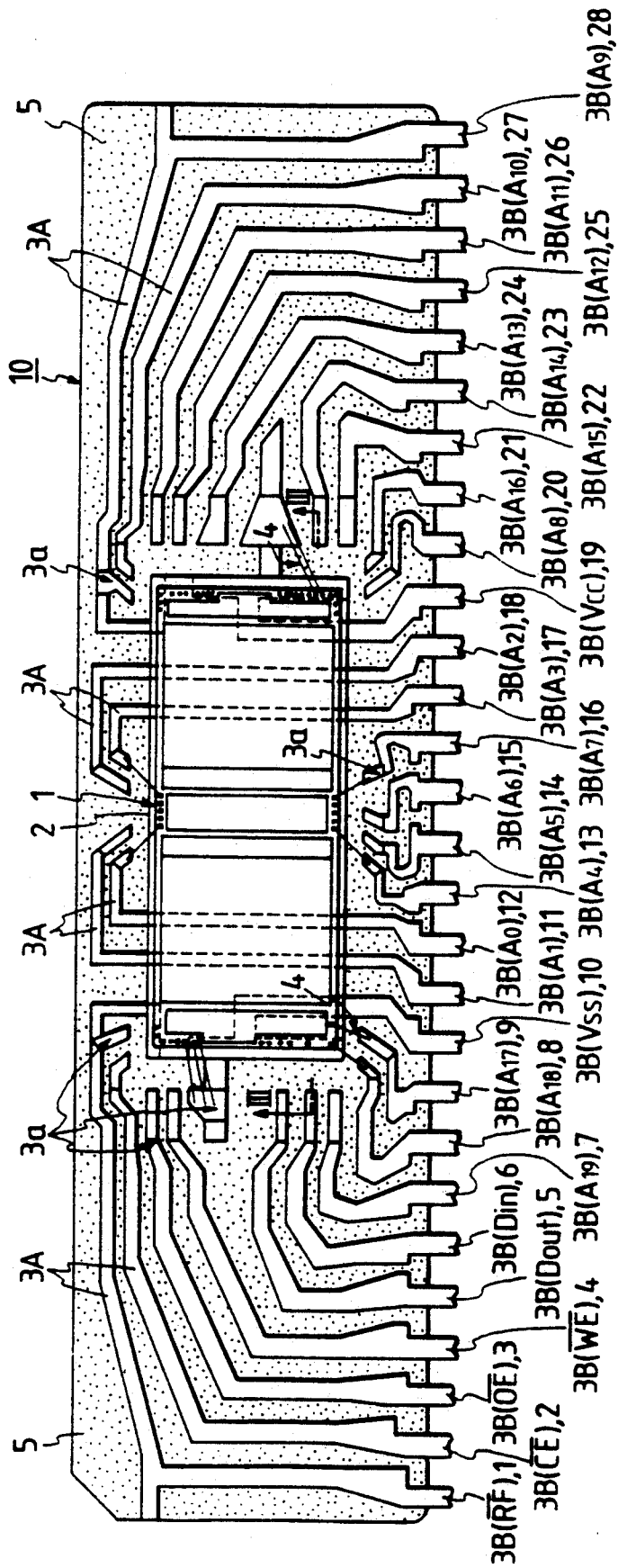
FIG. 15 is an enlarged cross-sectional view for a resin-encapsulated semiconductor device using a ZIP structure as a fourth embodiment according to the present invention.
Figure 16:
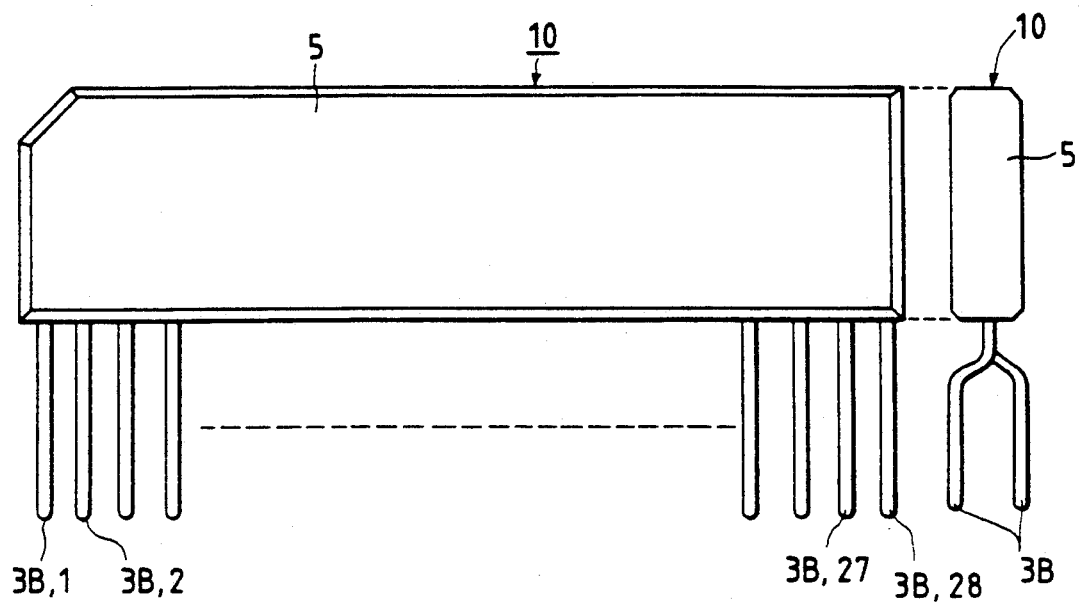
FIG. 16 is an outer view of the resin-encapsulated semiconductor device employing a ZIP structure as described above.

The resin-encapsulated semiconductor device using a ZIP structure as a fourth embodiment according to the present invention is shown in FIG. 16 (outer view) and FIG. 15 (enlarged cross-sectional view for a predetermined portion).

As shown in FIG. 16, in the resin-encapsulated semiconductor device 10 employing a ZIP structure, all of the outer leads (external pins) 3B are arranged on one end face of a resin-encapsulated portion (resin mold portion) 5 on the mounting side. That is, the resin-encapsulated semiconductor device 10 employing the ZIP structure is constituted as a Single In-Line Package structure and is mounted by inserting external pins into a mounting substrate.

Figure 17:
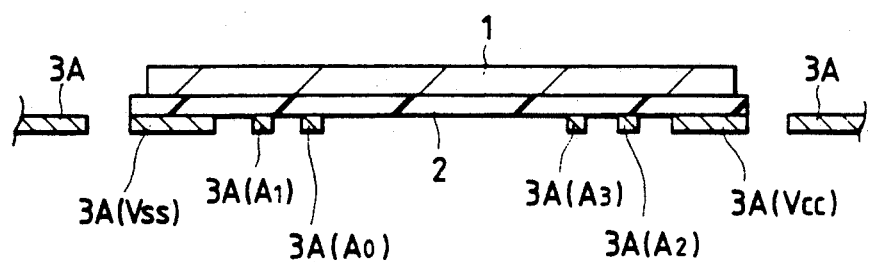
FIG. 17 is a cross-sectional view of a portion of the resin-encapsulated semiconductor device employing a ZIP structure as described above.

As shown in FIGS. 15 and 17 (cross sectional view taken along line III—III in FIG. 15), the resin encapsulated semiconductor device 10 employing the ZIP structure is constituted by stacking an insulation film 2 and a semiconductor pellet 1 successively on inner leads 3A.

The inner leads 3A and the outer leads 3B are formed respectively by applying punching or etching fabrication to an identical lead frame. That is, the inner leads 3A and the outer leads 3B are respectively formed integrally. The inner lead 3A and the outer lead 3B are made, for example, of an iron-nickel alloy (nickel content, for example of 50%). A Zn-Ni alloy plating layer, for example, is disposed on the surface of the iron-nickel alloy. The film thickness of the inner lead 3A and the outer lead 3B is made for example to about 200 μm. The inner lead 3A and the outer lead 3B may be formed also with copper (Cu) type material of excellent electrical and heat conductivity.

For the outer leads 3B, a number is attached to each of the terminals based on standards to define a signal applied to each of them. As described above, since the inner lead 3A is formed integrally with the outer lead 3B, the signal applied to the inner lead 3A is identical with that applied to the outer lead 3B. In FIG. 15, No. 1 terminal, No. 2 terminal-No. 28 terminal are respectively arranged successively from the leftmost end to the rightmost end of the resin-encapsulated semiconductor device 10 employing the ZIP structure, that is, the resin-encapsulated semiconductor device 10 employing the ZIP structure comprises 28 terminals (28 pins) in total.

Signals are applied as follows: refresh signal $\overline{RF}$ to No. 1 terminal (outer lead 3B); chip enable signal $\overline{CE}$ to No. 2 terminal; output enable signal $\overline{OE}$ to No. 3 terminal; write enable signal $\overline{WE}$ to No. 4 terminal; data output signal Dout to No. 5 terminal; data input signal Din to No. 6 terminal; address signal $A_{19}$ to No. 7 terminal; address signal $A_{18}$ to No. 18 terminal; address signal $A_{17}$ to No. 9 terminal; a reference power supply voltage $V_{ss}$, for example, the ground potential 0 (V) to No. 10 terminal; address signal $A_1$ to No. 11 terminal; address signal $A_0$ to No. 12 terminal; address signal $A_4$ to No. 13 terminal; address signal $A_5$ to No. 14 terminal; address signal $A_6$ to No. 15 terminal; address signal $A_7$ to No. 16 terminal; address signal $A_3$ to No. 17 terminal; address signal $A_2$ to No. 18 terminal; operation power supply voltage $V_{cc}$, for example, a circuit operation voltage 5 (V) to No. 19 terminal; address signal $A_9$ to No. 20 terminal; address signal $A_{16}$ to No. 21 terminal; address signal $A_{15}$ to No. 22 terminal; address signal $A_{14}$ to No. 23 terminal; address signal $A_{13}$ to No. 24 terminal; address signal $A_{12}$ to No. 25 terminal; address signal $A_{11}$ to No. 26 terminal; address signal $A_{10}$ to No. 27 terminal; and address signal $A_9$ to No. 28 terminal, respectively.

As shown in FIG. 15, the semiconductor pellet 1 is disposed at the central portion of the resin-encapsulated portion 5. The semiconductor pellet 1 is made of a single crystal silicon substrate of a planar rectangular shape. A DRAM having a large capacity of 1 Mbit is mounted on the device-forming surface of the semiconductor pellet 1 (the surface opposite to the surface facing the inner leads 3A). The semiconductor pellet 1 mounted with the DRAM is shown in FIG. 18 (chip layout view).

Figure 18:
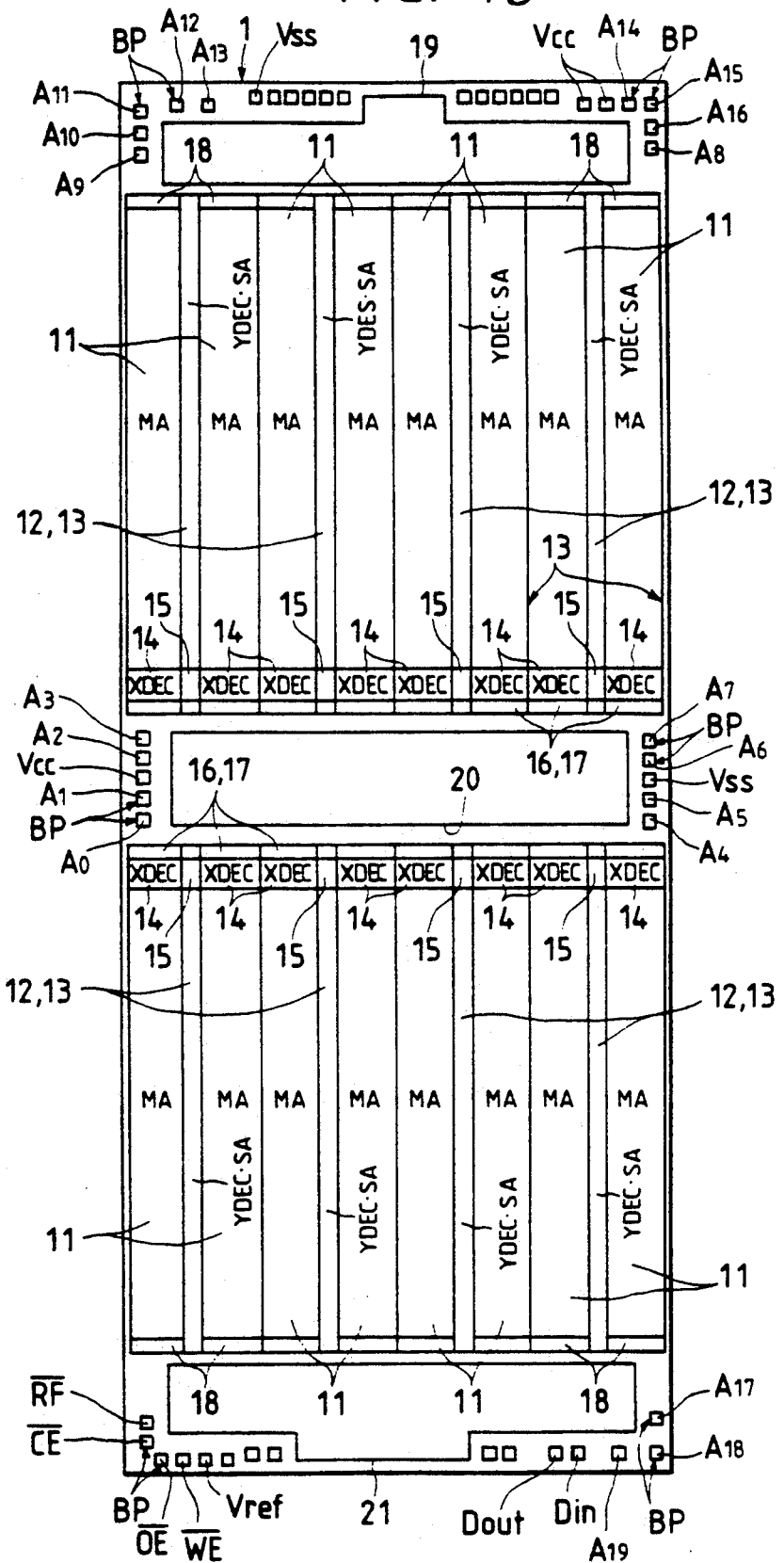
FIG. 18 shows a layout for the semiconductor pellet of the resin-encapsulated semiconductor device employing a ZIP structure as described above.

As shown in FIG. 18, memory cell array (MA) 11 is disposed at the central portion of the DRAM mounted on the device-forming surface of the semiconductor pellet 1. The memory cell array 11 is divided in the upper and the lower portions of the semiconductor pellet 1 each into 8 sections and, thus, divided into 16 sections in total. Each of memory cell arrays MA divided into 16 sections has a capacity of 64 Kbit.

A portion of a column address decoder circuit (YDEC) 12 and a portion of a sense amplifier circuit (SA) 13 are disposed respectively between two memory cell arrays (MA) among those divided into 16 sections. The sense amplifier circuit 13 comprises a complimentary MISFET (CMOS) and a portion of the sense amplifier circuit 13 is constituted with an n-channel MISFET. A p-channel MISFET as another portion of the sense amplifier circuit 13 is disposed at the end of the memory cell array MA at a position opposing to the portion described above. Complimentary data lines (two data lines) are extended from one side of the sense-amplifier circuit 13 onto the memory cell array MA, and the DRAM in this embodiment is constituted with a folded bit line system.

A row address decoder circuit (XDEC) 14 and a word driver circuit (not illustrated) are disposed at one end, on the central side, of each of the memory cell arrays MA divided into 16 sections. A data line precharge circuit 15, a common source change-over switch circuit 16 and a word line precharge circuit 17 are disposed respectively near the row address decoder circuit 14.

A common source change-over switch circuit 18 is disposed at the other end, on the peripheral side, of each of the memory cell arrays (MA) divided into 16 sections.

The circuits 12–18 disposed at the periphery of the memory cell arrays MA divided into 16 sections are referred to as direct peripheral circuits for the DRAM.

The column address decoder circuit (YDEC) 12, the sense-amplifier circuit 13 and a pair of memory cell arrays MA at both ends thereof, a pair of row address decoder circuits (XDEC) 14, the data precharge circuit 15, the common source change-over switch circuits 16, 18 and the word line precharger circuit 17 constitute a memory mat. That is, the DRAM comprises the memory mats divided into 8 sections. More specificaly, a pair of memory cell arrays and the direct peripheral circuits constitute the memory mat.

An upper side peripheral circuit 19 is disposed at the upper side, and a lower side peripheral circuit 21 is disposed at the lower side of the DRAM, respectively. A middle peripheral circuit 20 is disposed between the four memory mats disposed on the upper side of DRAM and the four memory mats disposed on the lower side of the DRAM. The peripheral circuits 19–21 are referred to as indirect peripheral circuits of the DRAM.

A plurality of memory cells each having 1 (bit) of information are arranged in a matrix on each of the memory arrays 11 of the DRAM. Each memory cell comprises a series circuit of a memory cell selecting MISFET and an information storing capacitive element. Each of the direct peripheral circuits 12–18 and indirect peripheral circuits 19–21 is basically constituted by a complimentary MISFET structure and a bipolar transistor in combination.

Figure 19:
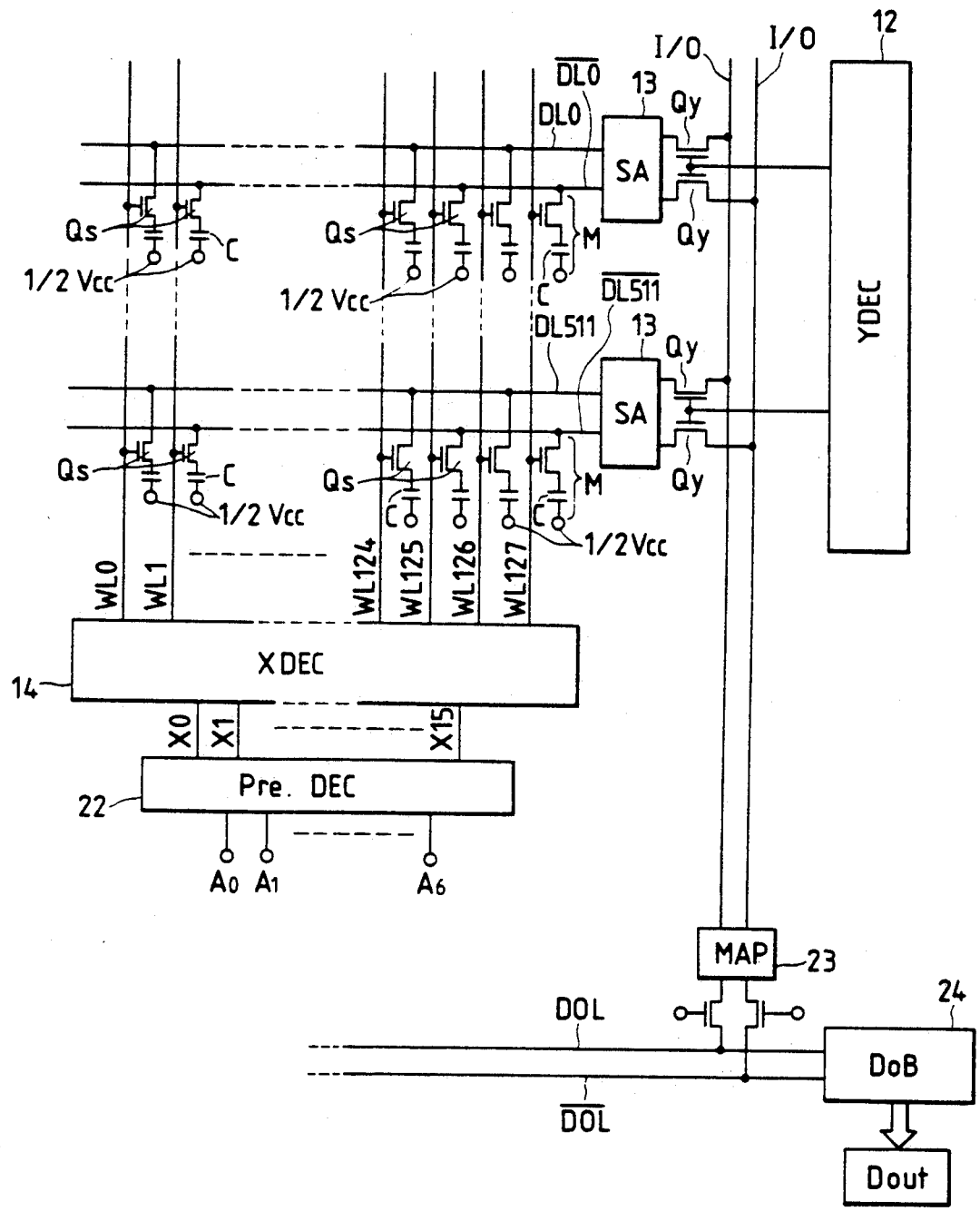
FIG. 19 is an equivalent circuit diagram for memory cells and peripheral circuits thereof.

Next, FIG. 19 shows an equivalent circuit of the memory cell and its peripheral circuits. Each memory cell M comprises a serial circuit of a memory cell selecting MISFET $Q_S$ and an information storing capacitive element C and is disposed at the intersection between a word line and a data line. Further, a voltage one-half of the power supply voltage Vcc ($\frac{1}{2}$ Vcc) for driving the memory mat is applied to one electrode of the information storing capacitance element C. As has been described above, each of the memory cell arrays has a capacitance of 64 Kbit and each of the memory cell arrays has 128 word lines WLO–WL127 and 512 pairs of data lines (DLO, $\overline{DLO}$–DL511, $\overline{DL511}$).

128 word lines WLO–WL127 are extended in the direction of the row and connected to the row address decoder circuit (XDEC) 14. In the row address decoder address (XDEC) 14, a word line is selected by pre-decode signals XO–X15 inputted from a predecoder circuit (Pre-DEC) 22. The pre-decode signals comprise address signals AO–A6 inputted from the outside.

Since the folded bit line system is employed in the DRAM, memory cells M connected to one data line (for example, DLO) are connected on every other word lines. The data lines extended in the direction of the column are paired each by two and connected to the sense-amplifier circuit 13.

For instance, in a case of reading information from a specified memory cell in the data line pairs, information for "H" or "L" which is read out from a specified memory cell is inputted by way of a reading switch MISFET $Q_Y$ and common I/O lines I/O, $\overline{I/O}$ to a main amplifier (MAP) 23 and amplified and then outputted by way of an output buffer circuit (DoB) 24 and an external terminal (Dout). Selection for the data line pairs is carried out in the column address decoder circuit (YDEC).

In FIG. 18, the pre-decoder circuit (Pre.DEC) 22 is disposed in the central peripheral circuit 20, while the main amplifier (MAP) 23 and the output buffer circuit (DoB) 24 are disposed in the lower peripheral circuit 21.

Now, the specific structure of the DRAM will be described referring to FIG. 20 (cross sectional view for a portion).

Figure 20:
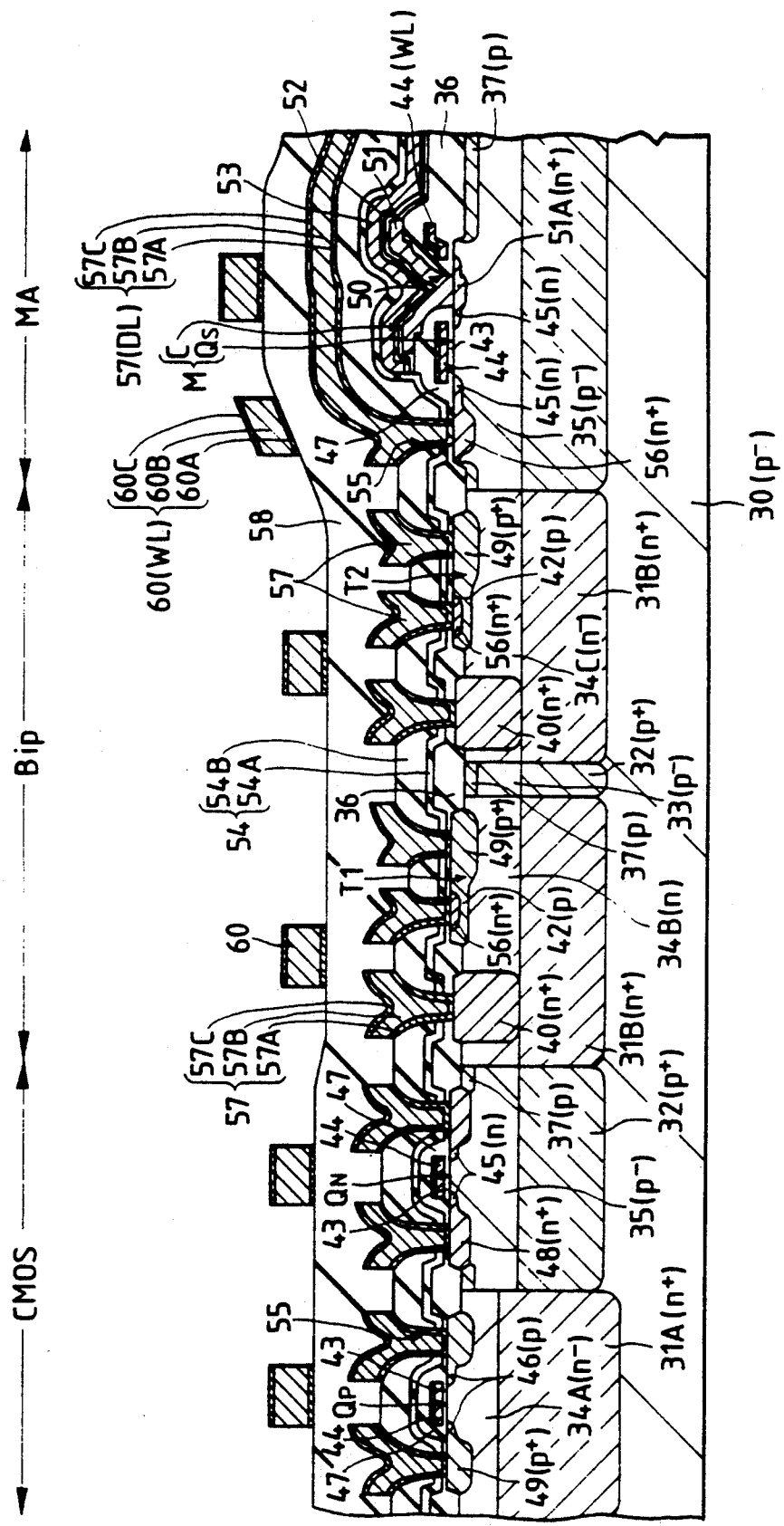
FIG. 20 is a cross-sectional view of a portion of a memory cell and peripheral circuit thereof.

FIG. 20 shows a CMOS region CMOS, a bipolar transistor region Bip and a memory cell array region MA of the DRAM respectively from the left to the right of the drawing.

As shown in FIG. 20, the DRAM comprises a $p^-$-semiconductor substrate 30 made of single crystal silicon and a substrate made of an epitaxial layer grown in the main surface thereof. Bipolar transistors T1, T2 are respectively disposed in the bipolar transistor forming region Bip of the DRAM. Each of the bipolar transistors T1 and T2 is disposed on the main surface of the p⁻-semiconductor substrate 30 in a region surrounded with a device isolation region. The device isolation region comprises the p-semiconductor substrate 30, a buried p+-semiconductor region 32, p⁻-well region 35, p-channel stopper region 37 and inter-device isolation insulative film 36. The buried p+-semiconductor region 32 forming the device isolation region is disposed between the p⁻-semiconductor substrate 30 and the p⁻-epitaxial layer 33. The p⁻-well region 35 is constituted such that the bottom surface is in contact (connected) with the buried type p+-semiconductor region 32. The p-channel stopper region 37 is disposed to the main surface of the p-well region 35. The field insulating film 36 is disposed on the main surface of the p⁻-well region 35. The field insulating film 36 is made of a silicon oxide layer formed by selectively oxidizing the main surface of the p⁻-well region 35.

Each of the bipolar transistors T1, T2 is constituted as a vertical npn structure comprising an n-collector region, a p-base region and an n-emitter region. The bipolar transistor T1 has a high frequency characteristic, while the bipolar transistor T2 has a high voltage withstanding characteristic.

The n-collector region comprises a buried n+-semiconductor region 31B, an n⁻-well region 34B or n-well region 34C and a collector potential raising n+-semiconductor region 40. The buried n+-semiconductor region 31B is disposed between the p⁻-semiconductor substrate 30 and the n-well region 34B. The buried n+-semiconductor region 31B is formed in self alignment relative to the buried p+-semiconductor region 32. Each of the n⁻-well region 34C and the n-well region 34B is used as an intrinsic collector region. Each of the n⁻-well region 34C and the n-well region 34B is formed in self alignment relative to the p⁻-well region 35. The collector potential raising n+-semiconductor region 40 is constituted such that the bottom surface thereof is in contact with the buried n+-semiconductor region 31B such that the collector potential of the buried n+-semiconductor region 31B can be taken out at the surface of the substrate.

The n-well region 34B, that is, the intrinsic collector region of the bipolar transistor T1 is formed at a higher impurity concentration as compared with that of the bipolar transistor T2. That is, since the resistance value in the intrinsic collector region can be lowered in the bipolar transistor T1, its high frequency characteristic can be improved. On the other hand, the n⁻-well region 34C, that is, the intrinsic collector region of the bipolar transistor T2 is formed with a lower impurity concentration as compared with that of the bipolar transistor T1. That is, since the voltage withstand of the pn junction between the intrinsic collector region and the p-base region can be increased in the bipolar transistor T2, the withstanding voltage can be increased.

The p-base region is constituted with a p-semiconductor region 42 used as an intrinsic base region and a p+-semiconductor region 49 used as a graft base region. The respective p-semiconductor region 42 and the p+-semiconductor region 49 are formed integrally and they are formed on the main surface of the n⁻-well region 34C or the n-well region 34B respectively.

The n-emitter region is constituted with an n+-semiconductor region 56. The n+-semiconductor region 56 is disposed at the main surface of the p-semiconductor region 42, that is, the intrinsic base region of the p-base region described above.

A wiring 57 is connected through a connection hole 55 formed in an inter-layer insulative film 54 to the collector potential raising n+-semiconductor region 40 in the n-collector region. Likewise, the wiring 57 is connected through a connection hole 55 formed in the inter-layer insulation film 54 to each of the p+-semiconductor region 49, that is, the graft base region of the p-base region and the n+-semiconductor region 56, that is, the n-emitter region. The inter-layer insulative film 54 is constituted as a dual layer structure prepared by successively laminating, for example, a silicon oxide film 54A and a BPSG (Boron-Phospho-Silicate Glass) film 54B respectively. The lower silicon oxide film 54A is disposed so as to prevent B or P in the upper BPSG film 54 from leaking to the device in the lower layer. The silicon oxide film 54A is deposited by means of a CVD process using an organic silane gas as a source gas or an inorganic silane gas and silicon nitride gas as a source gas. The upper BPSG film is constituted such that it can insulatively separate the lower device and the upper conduction layer and can flatten the surface. The BPSG film is deposited by means of a CVD process and applied with densification and reflow.

The wiring 57 is formed by a wiring forming step for the first layer in the manufacturing steps. The wiring 57 is constituted with a 3-layer structure prepared by successively laminating a transition metal silicide film 57A, an aluminum alloy film 57B and a refractory metal silicide film 57C respectively. For each of the refractory metal silicide films 57A and 57C, a $MoSi_2$ film is used for instance. Further, as each of the refractory metal silicides 57A and 57C, either $TaSi_2$, $TiSi_2$ or $WSi_2$ film may also be used. Further, a refractory metal nitride film, for example, TiN film may also be used instead of the lower transition metal silicide film 57A.

The lower refractory metal silicide film 57A in the wiring 57 is constituted such that growing of the silicon epitaxial layer can be prevented in the connection portion between the substrate (silicon) and the wiring 57 so that the resistance value in the connected portion can be reduced. The intermediate aluminum alloy film 57B is constituted as a main body for the wiring 57, in which copper (Cu) and silicon (Si) are added to aluminum. Cu has an effect capable of reducing migration. Si has an effect capable of reducing alloy spiking. The upper refractory metal silicide film 57C can reduce the optical reflection as compared with the surface of the lower aluminum alloy film 57B. That is, since the upper refractory metal silicide film 57C can reduce the diffraction of an etching mask (photoresist film) upon exposure and decrease the the fluctuation of the etching mask in the photolithography, it is constituted so as to improve the fabrication accuracy for the wiring 57. Further, the upper refractory metal silicide film 57C is constituted such that aluminum hill rock occurring at the surface of the middle aluminum alloy film 57B can be reduced.

A wiring 60 is disposed to the upper surface of the wiring 57 by way of an inter-layer insulative film 58. Although not illustrated in this region, the wiring 60 is connected through a connection hole 59 formed in the inter-layer insulative film 58 to the lower wiring 57. Although not shown specifically in FIG. 20, the inter-layer insulative film 58 is constituted, for example, as a three layer structure prepared by successively laminating a silicon oxide film deposited by a plasma CVD process, a silicon oxide film applied with a SOG (Spin On Glass) method and baking treatment, and a silicon oxide film deposited by means of a plasma CVD process respectively. The inter-layer insulative film 58 is constituted mainly for flattening the surface of the intermediate silicon oxide film.

The wiring 60 is formed by the wiring forming step for the second layer in the manufacturing steps. Substantially in the same manner as in the wiring 57, the wiring 60 is constituted as a three layer structure prepared by successively laminating a refractory metal silicide film 60A, an aluminum alloy film 60B and a refractory metal silicide film 60C respectively.

In the CMOS region CMOS of the DRAM, an n-channel MISFET $Q_N$ and a p-channel MISFET $Q_P$ are disposed respectively.

The n-channel MISFET $Q_N$ is formed on the main surface of a p$^-$-well region 35 within a region surrounded with a field insulating film 36 and a p-channel stopper region 37. The field insulating film 36 is formed with a silicon oxide film prepared by oxidizing the main surface of the p$^-$-well region 35. The p-channel stopper region 37 is disposed at the main surface of the p$^-$-well region 35 below the field insulating film 36. At the bottom of the p$^-$-well region 35, a buried p$^+$-semiconductor region 32 in contact (connection) therewith is disposed. The buried p$^+$-semiconductor region 32 is used as a portion of the p$^-$-well region 35 and set to a higher impurity concentration as compared with that of the p$^-$-well region 35. That is, since the buried p$^+$-semiconductor region 32 can reduce the specific resistivity at the bottom of the p$^-$-well region 35, it is constituted such that parasitic thyristor operation inherent to CMOS can be prevented. Each of the p$^-$-well region 35, the buried p$^+$-semiconductor region 32 and the p-channel stopper region 37 is formed with a layer identical with each of the p$^-$-well region 35, the buried p$^+$-semiconductor region 32 and the p-channel stopper region 37 for the device isolation region of the bipolar transistor region Bip respectively.

The n-channel MISFET $Q_N$ mainly comprises the p$^-$-well region 35, a gate insulation film 43, a gate electrode 44, and a pair of n-semiconductor regions 45 and a pair of n$^+$-semiconductor regions 48 which are the source region and the drain region.

The p$^-$-well region 35 is used as the channel-forming region. The gate insulation film 43 is formed by a silicon oxide film prepared by oxidizing the main surface of the p$^-$-well region 35. The gate electrode 44 is constituted with a composite film comprising a polycrystalline silicon film and a refractory metal silicide film (high melting metal silicide film) laminated on the upper surface thereof. Not restricted only to the composite film described above, the gate electrode 44 may also be constituted with a polycrystalline silicon film, a refractory metal silicide film, a refractory metal film (high melting metal film: Mo, Ti, Ta, W), or a composite film comprising a polycrystalline silicon film and a refractory metal silicide film or a refractory metal film (laminated) on the upper surface thereof. The gate electrode 44 is formed by the gate wiring forming step for the first layer in the manufacturing steps.

The n-semiconductor region 45 at a low impurity concentration is disposed between an n$^+$-semiconductor region 48 at a high impurity concentration and a channel-forming region. The n-semiconductor region 45 constitutes the n-channel MISFET $Q_N$ as a so-called LDD (Lightly Doped Drain) structure. The N-semiconductor region 45 is formed by self alignment relative to the gate electrode 44. The n$^+$-semiconductor region 48 at a high impurity concentration is formed by self alignment relative to a side wall spacer 47 formed at the side wall of the gate electrode 44 by self alignment thereto. The side wall spacer 47 is formed, for example, with a silicon oxide film.

A wiring 57 is connected through a connection hole 55 formed in an inter-layer insulative film 54 to an n$^+$-semiconductor region 48 as the source region and the drain region of the n-channel MISFET $Q_N$. The wiring 57 is formed with a layer identical to that of the wiring 57 formed in the bipolar transistor region Bip described above.

The p-channel MISFET $Q_P$ is formed on the main surface of an n$^-$-well region 34A within a region surrounded by a field insulating film 36. At the bottom of the n$^-$-well region 34A, a buried n$^+$-semiconductor region 31A in contact (connected) therewith is disposed. The buried n$^+$-semiconductor region 31A is used as a portion of the n-well region 34A and set at a higher impurity concentration as compared with that of the n$^-$-well region 34A. Like that of the buried p$^+$-semiconductor region 32, the buried n$^+$-semiconductor region 31A is constituted such that the specific resistivity at the bottom of the n$^-$-well region 34A can be reduced and the parasitic thyristor operation can be prevented. Each of the n$^-$-well region 34A and the buried n$^+$-semiconductor region 31A is formed with a layer substantially identical with each of the n$^-$-well region (intrinsic collector region) 34C and the buried n$^+$-semiconductor region (buried collector region) 31B of the bipolar transistor region Bip respectively. In the buried n$^+$-semiconductor region 31A, the size of the region along the depth direction of the substrate is made larger as compared with that in the buried n$^+$-semiconductor region 31B of the bipolar transistor Bip. That is, in the buried n$^+$-semiconductor region 31A, the constituent n-impurity (P in this case) positively rises toward the n$^-$-well region 34A. As a result, the depth from the surface in the n$^-$-well region 34A for forming the p-channel MISFET $Q_P$ (depth down to the buried n$^+$-semiconductor region 31A) is constituted less deep as compared with that of the n$^-$-well region 34C in the bipolar transistor region Bip.

The p-channel MISFET $Q_P$ mainly comprises the n$^-$-well region (channel forming region) 34A, the gate insulation film 43, a gate electrode 44 and a pair of p-semiconductor regions 46 and a pair of p$^+$-semiconductor regions 49 as the source region and the drain region respectively. The p-channel MISFET $Q_P$ is constituted with the LDD structure like that of the n-channel MISFET $Q_N$.

The n$^-$-well region 34A in which the p-channel MISFET $Q_P$ is formed is constituted with less depth as described above and, in the n$^-$-well region 34A, a region from its surface to the depth twice of the junction depth (xj) of the p$^+$-semiconductor region 49 in the p-channel MISFET $Q_p$ is constituted with a higher impurity concentration as compared with that in the n$^-$-well region 34C in the bipolar transistor region Bip described above. The impurity concentration in the n$^-$-well region 34A is increased by the arising of the n-impurity in the lower buried n$^+$-semiconductor region 31A toward the n$^-$-well region 34A. The region from the surface of the n$^-$-well region 34A to the depth twice of the junction depth is a region in which a depletion region is extended from the pn junction between the p$^+$-semiconductor region 49 and the n$^-$-well region 34A toward the n$^-$-well 34A in the p-channel MISFET $Q_p$ and in which punch through is formed. In the DRAM of this embodiment, since the punch through occurs within a range from the region of about 0.2 μm to a deep region of about 0.8 μm from the surface, the $n^-$-well region 34A is constituted with a higher impurity concentration as compared with that of the identical region in the $n^-$-well region 34C within the range as described above. The junction depth of the $p^+$-semiconductor region 49 of the p-channel MISFET $Q_p$ is constituted at about 0.5 μm in this embodiment.

A wiring 57 is connected through a connection hole 55 formed in an inter-layer insulative film 54 in the $p^+$-semiconductor region 49 as the source region and the drain region of the p-channel MISFET $Q_P$.

As described above, in the DRAM comprising bipolar transistors T (T1, T2) prepared by successively disposing the $n^-$-well region (intrinsic collector region) 34C and the buried $n^+$-semiconductor region (buried collector region) 31B respectively along the direction of the depth of the substrate and the p-channel MISFET $Q_P$ formed in a region, in which the $n^-$-well region 34A and the buried $n^+$-semiconductor region 31A are formed, respectively, with identical layers and with identical conductivity types with those of the $n^-$-well region 34C and the buried $n^+$-semiconductor region 31D are successively disposed along the direction of the depth of the substrate, the depth of the $n^-$-well region 34A forming the p-channel MISFET $Q_P$ from the surface of the substrate is made less deep as compared with the depth of the $n^-$-well region (intrinsic collector region) 34C of the bipolar transistor T. Since the $n^-$-well region 34A of the region for forming the p-channel MISFET $Q_P$ can be made less deep and the depth of the buried $n^+$-semiconductor region 31A at a higher impurity concentration as compared with that of the $n^-$-well region 34A from the surface of the substrate can be made less deep with this constitution, it is possible to increase the impurity concentration of the $n^-$-well region 34A on the side of the surface to reduce the punch through (or reduce the short-channel effect) in the p-channel MISFET $Q_p$, to enable a higher degree of integration for the p-channel MISFET $Q_P$. Also, it is possible to make the $n^-$-well region 34C as the intrinsic collector region of the bipolar transistor deeper and to isolate the p-base region formed at the main surface of the $n^-$-well region 34C (p-semiconductor region 42, $p^+$-semiconductor region 49) and the buried $n^+$-semiconductor region 31B, and, accordingly, voltage withstand at the pn junction between the p-base region and the n-collector region can be improved and the voltage withstand of the bipolar transistor T can be improved.

In addition, since the n-impurity at high concentration is not introduced to the main surface portion of the $n^-$-well region (channel forming region) 34A for reducing the punch through in the p-channel MISFET $Q_P$ (counter doping), it is possible to reduce the impurity scattering and increase the amount of source-drain current $I_{ds}$ and, accordingly, it is possible to increase the operation speed.

As shown in FIG. 19, a plurality of memory cells M are disposed in a matrix in the memory cell array MA of the DRAM.

As shown in FIG. 20, a memory cell selecting MISFET $Q_S$ of the memory cell M is formed at the main surface of a $p^-$-well region 35 within a region surrounded with a field insulating film 36 and a p-channel stopper region 37. An buried $p^+$-semiconductor region 32 is disposed at the bottom of the $p^-$-well region 35 like that the $p^-$-well region 35 in which the n-channel MISFET $Q_N$ is formed. The memory cell selecting MISFET $Q_S$ mainly comprises the $p^-$-well region (channel forming region) 35, a gate insulative film 43, a gate electrode 44 and a pair of n-semiconductor regions 45 as the source region and the drain region. The memory cell selecting MISFET $Q_S$ comprises substantially the same structure as that in the n-channel MISFET $Q_N$ except for the source region and the drain region. The n-semiconductor region 45 as the source region and the drain region for the memory cell selecting MISFET $Q_S$ is formed by introducing less than $10^{14}$ atoms/cm$^2$ of n-impurity (for example, P) by ion implantation. That is, the n-semiconductor region 45 is so constituted that the number of crystal defects caused by the introduction of the n-impurity is reduced, the crystal defects are sufficiently recovered by a heat treatment after the introduction, and the amount of leakage current at the pn junction, that is, the amount of leakage for static charges as the information of the information storing capacitive element C is reduced. Since the n-semiconductor region 45 is formed at a lower impurity concentration, the memory cell selecting MISFET $Q_S$ is constituted with the LDD structure like that in the n-channel MISFET $Q_N$.

The gate electrode 44 is constituted integrally with the word line (WL) 44 extended in the direction of the row. That is, the gate electrode 44 and the word line 44 are formed with an identical conduction layer respectively. The word line 44 is so constituted to connect the respective gate electrodes 44 for the memory selecting MISFET $Q_S$ for a plurality of memory cells M disposed in the direction of the row.

The gate length of the gate electrode 44 for the memory cell selecting MISFET $Q_S$ is set to 1.0 μm.

A complimentary data line (DL) 57 is disposed through a connection hole 55 formed in an inter-layer insulative film 14 to the n-semiconductor region 45 on one side (on the side connected with the complimentary data line) of the memory cell selecting MISFET $Q_S$. The n-semiconductor region 45 and the complimentary data line 57 are connected by way of the $n^+$-semiconductor region 56. The $n^+$-semiconductor region 56 and the n-semiconductor region 45 on one side are formed integrally. The $n^+$-semiconductor region 56 is formed by introducing n-impurity to the main surface of the $p^-$-well region 35 within a region defined by the connection hole 55. The $n^+$-semiconductor region 56 is so constituted that the complimentary data line 57 and the $p^-$-well region 35 are not short-circuitted even when erroneous mask alignment is caused for each of the connection hole 55 and the field insulating film 36 in the manufacturing steps. Further, the $n^+$-semiconductor region 56 can reduce the contact resistance value for each of the complimentary data line 57 and the n-semiconductor region 45 on one side.

The other n-semiconductor region 45 of the memory cell selecting MISFET $Q_S$ (on the side connected with the information storing capacitive element C) is connected with a lower electrode layer 51 of the information storing capacitive element C described later and they are connected by way of an $n^+$-semiconductor region 51A. The $n^+$-semiconductor region 51A is formed integrally with the other n-semiconductor region 45. The $n^+$-semiconductor region 51A is formed by diffusing the n-impurity introduced into the lower electrode layer 51 to the main surface of the p-well region 35. The $n^+$-semiconductor region 51A is so constituted that the contact resistance value between the other n-type semiconductor region 45 and the lower electrode layer 51 can be reduced. Further, the n+-semiconductor region 51A is constituted such that the parasitic capacitance added to the pn junction between the other n-semiconductor region 45 and the p−-well region 35 can be increased and the charge accumulation amount in the charge storing capacitive element C can be increased.

An insulation film (silicon oxide film) not attached with a reference numeral is disposed at the upper layer of the gate electrode 44 of the memory cell selecting MISFET $Q_S$ and a side wall spacer 47 is disposed at the side wall for each of the insulative film and the gate electrode 44.

As shown in FIG. 20, the information storing capacitive element C of the memory cell M mainly comprises a lower electrode layer 51, a dielectric film 52 and an upper electrode layer 53 laminated successively. That is, the information storing capacitive element C is constituted as a so-called stacked structure (laminated structure: STC).

A portion (central portion) of the lower electrode layer 51 of the information storing capacitive element C of the stacked structure is connected with the other n-semiconductor region 45 of the memory selecting MISFET $Q_S$.

The lower electrode layer 51 of the information storing capacitive element C of the stacked structure is formed, for example, by a polycrystalline silicon film deposited by a CVD process and an n type impurity (As or P) for reducing the resistance value is introduced at a high concentration to the polycrystalline silicon film The lower electrode layer 51 is formed with a relatively thick, for example, about 200 to 400 nm thickness for increasing the charge storing amount of the information storing capacitive element C of the stacked structure, by utilizing the stepped shape of the underlying material and utilizing the side wall. The lower electrode layer 51 is formed by the gate wiring forming step for the second layer in the manufacturing steps.

The dielectric film 52 basically has a dual layer structure comprising a silicon nitride film deposited on the upper layer (on the surface) of the lower electrode layer (polycrystalline silicon film) 51 and a silicon oxide film prepared by oxidizing the silicon nitride film under a high pressure. Since a spontaneously oxidized silicon film is formed at the surface of the polycrystalline silicon film as the lower electrode layer 51 (not illustrated since it is an extremely thin film of less than 5 nm, the dielectric film 52 is actually constituted with a three layer structure in which the spontaneously oxidized silicon film, the silicon nitride film and the silicon oxide film are successively laminated. Since the lower silicon nitride film of the dielectric film 34 is deposited by means of the CVD process, it can be formed under process conditions independent from the underlying material free from the effect of the state of the crystallization or the stepped shape of the underlying lower electrode layer 51. That is, since the silicon nitride film has higher insulation voltage withstanding capability and a lesser number of defects per unit area as compared with the silicon nitride film formed by nitriding the surface of the lower electrode layer 51, the leakage current is extremely low. In addition, the silicon nitride film has a feature that the dielectric constant is higher as compared with the silicon oxide film. The upper silicon oxide film can be formed as a film of extremely good quality. Further, as described specifically later, since the silicon oxide film can be formed under high pressure oxidization (1.5 to 10 torr), it can be formed in a shorter oxidation time, that is, heat treatment time as compared with oxidation under atmospheric pressure.

The dielectric film 52 is formed along the upper surface and the side wall of the lower electrode layer 51 and the area is increased along the direction of height by utilizing the side wall portion of the lower electrode layer 51. Increased area of the dielectric film 51 can improve the charge accumulation amount in the information storing capacitive element C of the stacked structure. The planer shape of the dielectric film 52 is defined with the planer shape of the upper electrode layer 53 and it is constituted to have substantially the same shape as that of the upper electrode layer 53.

The upper electrode layer 53 is disposed above and so as to cover the lower electrode layer 51 by way of the dielectric film 52. The upper electrode layer 53 is formed integrally with the upper electrode layer 53 of the information storing capacitive element C of the stacked structure in another adjacent memory cell M. The upper electrode 53 is applied with a fixed potential of ½ Vcc. The upper electrode layer 53 is formed, for example, with a polycrystalline silicon film deposited by a CVD process and an n type impurity is introduced into the polycrystalline silicon film for reducing the resistance value. The upper electrode layer 53 is formed by the gate wiring forming step for the third layer in the manufacturing steps. The upper electrode layer 53 is formed, for example, with substantially the same film thickness as that for the lower electrode layer 51.

The memory cell M is connected with another memory cell M adjacent in the direction of the row. That is, two memory cells M adjacent in the direction of the row are formed integrally with one of the n-semiconductor regions 45 for respective memory cell selecting MISFETs $Q_S$ and they are constituted respectively in a reversed pattern around the portion as a center. The two memory cells M are disposed in the direction of the row and the two memory cells M and other two memory cells M adjacent in the direction of the row are disposed while being displaced from each other at a ½ pitch in the direction of the row.

The complimentary data line 57 is disposed by way of the inter-layer insulative film 54 on the upper electrode layer 53 of the information storing capacitive element C of the stacked structure by way of the inter-layer insulative film 54. The complimentary data line 57 is formed with a layer identical with that of the wiring 57. A shunting word line (WL) 60 is disposed on the complimentary data line 57 by way of the inter-layer insulative film 58. The shunting word line 60 is connected to the word line (WL) 44 at a predetermined region on every several tens to several hundreds memory cells M. The word line 44 is divided into a plurality of portions in the extending direction in the memory cell array MA and the shunting word line 60 is connected to each of a plurality of divided word lines 44. The shunting word line 60 is so constituted that the resistance value of the word line 44 is reduced and the selecting speed for the memory cell M can be increased in each of the information writing operation and the information reading operation. The shunting word line 60 is formed with a conductive layer identical with that for the wiring 60.

The direct peripheral circuits and the indirect peripheral circuits of the memory cell array MA are constituted with their bipolar transistors T1 and T2, and n-channel and p-channel MISFETs.

Since the DRAM mounted on the semiconductor pellet 1 employs an address non-multi system, as shown in FIG. 18, a plurality of external terminals (bonding pads) BP are disposed on the device-forming surface in the peripheral portion along each side of the rectangular shape. External terminals BP applied with address signals A11, A12, A13, A14 and A15, reference power supply voltage Vss and operation power supply voltage Vcc, respectively, are disposed in a region along the upper shorter side of the semiconductor pallet 1. External terminals BP applied with output enable signal $\overline{OE}$, write enable signal $\overline{WE}$, data output signal Dout, data input signal Din and address signals $A_{19}$, $A_{18}$, respectively, are disposed in a region along the lower shorter side of the semiconductor pellet 1. Further, an external terminal BP applied with a reference voltage Vref is disposed in this region. External terminals BP applied with address signals $A_0$, $A_1$, $A_2$, $A_3$, $A_9$ and $A_{10}$, refresh signal $\overline{RF}$, chip enable signal $\overline{CE}$ and operation power supply voltage Vcc, respectively, are disposed in the region along the longer side on the left. External terminals BP applied with address signals $A_4$, $A_5$, $A_6$, $A_7$, $A_8$, $A_{16}$ and $A_{17}$ and reference power supply voltage Vss, respectively, are disposed in a region along the longer side on the right.

The semiconductor pellet 1 mounted with the DRAM is constituted with a chip size, for example, of $5.3 \times 12.4$ mm$^2$. In FIG. 1, the semiconductor pellet 1 is disposed such that the upper peripheral circuit 19 in FIG. 18 is situated on the right.

As shown in FIG. 15, the external terminals BP of the semiconductor pellet 1 are electrically connected with top ends of the inner leads 3a that are extended around the resin-encapsulated portion 5. The connection is conducted by means of bonding wires 4. As the bonding wire 4, an Au wire is used, for example. The ball bonding wire 4 is not restricted only thereto and it is bonded by means of a ball bonding method. In the ball bonding method, a metal ball is formed on one end of the bonding wire 4 and the metal ball is bonded to the external terminal BP by thermocompression bonding in combination with ultrasonic vibrations. The bonding wire 4 is bonded at the other end thereof to the surface of the inner lead 3A in the same way under thermocompression bonding in combination with ultrasonic vibrations. A Cu or Al wire may also be used as the bonding wire 4.

FIG. 15 shows that specific lead frames and a bonding pads corresponding thereto are connected by means of bonding wires for the sake of simplicity of the drawing but, actually, all of the lead frames are connected with bonding pads corresponding thereto.

An Ag plating layer 3a is disposed at the surface of the top end of the inner lead 3A, that is, in the bonding region. The Ag plating layer 3a is formed with an aim of improving the bondability upon connection between the surface of the inner lead 3A and the bonding wire 4.

An insulation film 2 is disposed between the inner lead 3A and the semiconductor pellet 1 mainly for electrically separating both of them and also bonding them to each other. The insulation film 2 is formed, for example, with a polyimide resin film which is a thermosetting resin. The polyimide resin film is formed to a thickness, for example, of about 100 to 300 μm. Further, an adhesive layer is formed at the surface of the insulation film 2. The insulation film 2 is formed to a planar rectangular shape substantially identical with that of the semiconductor pellet 1, with a somewhat larger planar size than that of the semiconductor pellet 1.

The resin-encapsulated portion 5 is formed, for example, with a phenol curing type epoxy resin. Silicone rubber and filler are added to the phenol curing type epoxy resin. The silicone rubber added by a slight amount has an effect of reducing the elasticity of the phenol curing type epoxy resin. The filler is formed with spherical silicon dioxide particles and has an effect of lowering the heat expansion coefficient.

The resin-encapsulated semiconductor device 10 employing the ZIP structure has a size of 400 mil.

As shown in FIGS. 15 and 17, the resin-encapsulated semiconductor device 10 employing ZIP structure thus constituted is formed as a so-called tabless structure without using a tab. By the elimination of the tab, inner leads 3A are disposed at the rear face of the semiconductor pellet 1 by way of the insulation film 2, and the inner leads 3A are arranged such that they can extend across the semiconductor pellet 1. Since the external terminals BP are disposed along each of the sides in the semiconductor pellet 1, as described above, the inner leads 3A connected with the external terminals BP opposed to the surface of the resin-encapsulated portion arranged with the outer leads 3B and disposed along the most remote side of the semiconductor pellet pass beneath of the semiconductor pellet 1. The side of the semiconductor pellet 1 most remote from the surface disposed with the outer leads 3B is the upper side in FIG. 15 and corresponds to the left longer side in FIG. 18. The inner leads 3A passing beneath the semiconductor pellet 1 are for address signals $A_1$ (No. 11 terminal), $A_0$ (No. 12 terminal), $A_3$ (No. 17 terminal) and $A_2$ (No. 18 terminal), i.e., a total of four. The four inner leads 4A support the semiconductor pellet 1 by way of the insulation film 2.

The lateral size for the portion of each of the four inner leads 3A passing under the semiconductor pellet 1 that overlaps with the semiconductor pellet 1 is made smaller than the lateral size of the portion for each of other inner leads 3A extended around the inside of the resin-encapsulated portion 5. Further, the lateral size for each of the four inner leads 3A is made smaller than lateral size of the inner leads 3A applied with the reference power supply voltage Vss and the operation power supply voltage Vcc. That is, the four inner leads 3A are constituted such that the parasitic capacitance formed between them and the semiconductor pellet 1 by way of the insulation film 2 is reduced by reducing the lateral size of the leads. The narrowed lateral size of the inner leads 3 results in an increase of the resistance value. However, since the parasitic capacitance has a greater effect in increasing the access speed as compared with the increase of the resistance value in this embodiment, the parasitic capacitance is positively reduced and the access speed is improved.

Further, an inner lead 3A (No. 10 terminal) applied with the reference power supply voltage Vss and an inner lead 3A (No. 19 terminal) applied with an operation power supply voltage Vcc (i.e., two terminals in total), are disposed under the semiconductor pellet 1 by way of the insulation film 1. The lateral size for each of the two inner leads 3A is made greater than the lateral size for the portion of each of other inner leads 3A extended around the inside of the resin-encapsulated portion 5. The inner lead 3A applied with the reference power supply voltage Vss is disposed at the right of the lower shorter side (on the side of the lower peripheral circuit 21) in FIG. 18. The inner lead 3A applied with the operation power supply voltage Vcc is disposed at the right of the upper shorter side (on the side of the upper peripheral circuit 19) in FIG. 18. That is, the two inner leads 3A are disposed on the opposing shorter sides of the semiconductor pellet 1, respectively, for supporting the two corners of the semiconductor pellet 1. Since the lateral size for each of the four inner leads 3A applied with the address signals $A_0$, $A_1$, $A_2$, $A_3$ is positively narrowed, the semiconductor 1 is substantially supported by the two inner leads 3A applied with the power supply.

The inner lead 3A applied with the reference power supply voltage Vss and the inner lead 3A applied with the operation power supply voltage Vcc are directly integrated with the outer leads 3B near the shorter sides of the semiconductor pellet 1 respectively. That is, the respective two inner leads 3A have less regions extended around the inside of the resin-encapsulated portion 5 and are constituted each with a shorter size so as to reduce the inductance.

Further, each of the inner lead 3A applied with the refresh signal $\overline{RF}$ and the inner lead 3A applied with the address signal $A_9$ is branched into two ways at the top end respectively. One of the branches at the top end of the inner lead 3A is connected as a bonding region with the bonding wire 4. The other of the branches at the top end of the inner lead 3A is disposed under the semiconductor pellet 1 by way of the insulation film 2. The respective other branches are so constituted that they support other two points of the semiconductor pellet 1 than the two points supported by the inner leads 3A applied with the reference power supply voltage Vss and the operation power source supply voltage Vcc respectively. That is, the other branch at the top end of the inner lead 3A applied with the refresh signal $\overline{RF}$ is disposed at the left of the lower shorter side (on the side of the lower peripheral circuit 21) in FIG. 18. Further, the other branch at the top end of the inner lead 3A applied with the address signal $A_9$ is disposed at the left in the upper shorter side (on the side of the upper peripheral circuit 19) in FIG. 18. That is, the top ends of the four inner leads 3A applied respectively with the reference power supply voltage Vss, the operation power supply voltage Vcc, the refresh signal $\overline{RF}$ and the address signal $A_9$ are disposed at the respective corners of the semiconductor pellet 1 and bonded to the respective corners of the rectangular shape of the insulation film 2. That is, the insulation film 2 is supported by four points at its respective corners. Accordingly, the insulation film 2 can be supported on the inner leads 3A at an appropriate tension.

In this way, in the resin-encapsulated semiconductor device 10 of a ZIP structure in which the semiconductor pellet 1 having a plurality of external terminals BP disposed on the device-forming surface along each side of the planar rectangular shape is encapsulated with the resin-encapsulated portion 5, the insulation film 2 is present at the rear face of the semiconductor pellet 1 opposing to the device-forming surface, the inner leads ($A_0$, $A_1$, $A_2$, $A_3$) 3A for address signals electrically connected with the external terminals BP opposed to the surface of the resin encapsulated portion 5 disposed with the outer leads 3B and disposed along the most remote side of the semiconductor pellet 1 are disposed, the insulation film 2 is present at the rear face of the semiconductor pellet 1, and the inner leads 3A for power supply (Vss, Vcc) for supporting the semiconductor pellet 1 are disposed. In such a structure, since the inner leads 3A for signals electrically connected with the external terminals BP disposed along the most remote side of the semiconductor pellet 1 can be extended around within the area occupied by the semiconductor pellet 1 and the size of the resin-encapsulated portion 5 can be reduced by an amount corresponding to the extension of the inner leads 3A for signals, it is possible to reduce the size of the resin-encapsulated semiconductor device 10 of the ZIP structure. In addition, since the support for the semiconductor pellet 1 and the insulation film 2 can be reinforced with the inner lead 3A for power supply respectively and the semiconductor pellet 1 can be held stably, the yield of the resin-encapsulated semiconductor device 10 of ZIP structure can be improved. Further, since the length of the inner leads 3A for signals disposed at the back of the semiconductor pellet 1 can be shortened as compared with the case of extending them around and the inductance of the inner leads 3A for signals can be reduced, it is possible to reduce signal noise, prevent misoperation of the DRAM mounted on the semiconductor pellet and improve the electric reliability of the resin-encapsulated semiconductor device 10 of the ZIP structure. Furthermore, since the size of the resin-encapsulated semiconductor device 10 of the ZIP structure is reduced, the mounting density on the memory board can be increased.

The constitution of such inner leads 3A is particularly effective in a case where the row address decoder circuit 14 and the bonding pad for address signals inputted into the row address circuit 14 are situated at the central portion of the semiconductor pellet 1. That is, access speed can be increased.

Further, the lateral size of the inner leads 3A for signals disposed by way of the insulation film 2 to the rear face of the semiconductor pellet 1 is made smaller than the lateral size of the portions of other inner leads 3A for signals that are extended around at the periphery of the semiconductor pellet 1. With such a constitution, since the parasitic capacitance formed between the inner leads 3A for signals disposed at the rear face of the semiconductor pellet 3 and the semiconductor pellet 1 can be reduced to increase the transmission speed of the address signal along the inner lead 3A for signals, it is possible to increase the operation speed of the resin-encapsulated semiconductor device 10 (DRAM) of the ZIP structure.

Further, the lateral size of each of the inner leads 3A for power supply disposed to the rear face of the semiconductor pellet 1 by way of the insulation film 2 is made larger than the lateral size of each of the inner lead 3A for signals disposed to the rear face of the semiconductor pellet 1 by way of the insulation film 2. With this structure, since it is possible to increase the parasitic capacitance formed between the inner lead 3A for the power supply and the semiconductor pellet 1 and the noises of the power supply used for the DRAM mounted on semiconductor pellet 1 can be reduced by the coupling effect, the electric reliability of the resin-encapsulated semiconductor device 10 of the ZIP structure can be improved. Further, since the inductance of the inner leads 3A for the power supply can be decreased to reduce the power supply noises, the electric reliability of the resin-encapsulated semiconductor device of the ZIP structure can be improved. Further, since the inner leads 3A for the power supply and the inner leads 3A for signals disposed at the rear face of the semiconductor pellet 1 can dissipate the heat generated upon operation of the DRAM mounted on the semiconductor pellet 1 to the outside of the resin-encapsulated portion 5 by way of the insulation film 2, the inner leads 3A for power supply and the four inner leads 3A for signals disposed at the rear face of the semiconductor pellet 1 respectively, the heat resistance of the resin-encapsulated semiconductor device 10 can be reduced.

In the resin-encapsulated semiconductor device 10 employing a ZIP structure, although the inner leads 3A for electric supply are used for the support of the semiconductor pellet 1, non-connection inner leads (empty pin), if any, may be used.

Description will now be made to a fifth embodiment of a resin-encapsulated semiconductor device using a ZIP structure in which the shape of the inner lead is changed. FIG. 19 shows the fundamental structure of a resin-encapsulated semiconductor device using the ZIP structure (enlarged cross sectional view for a portion, outer view).

Figure 21:
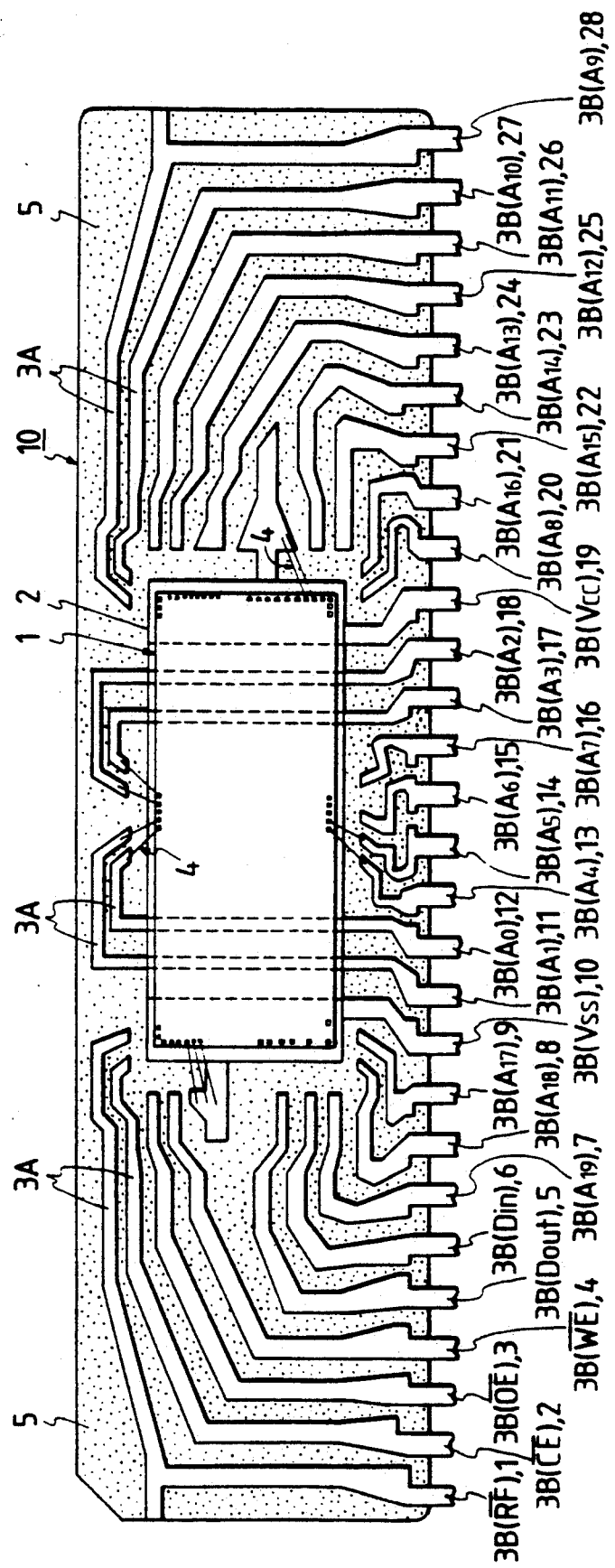
FIG. 21 is an enlarged cross-sectional view of a resin-encapsulated semiconductor device employing a ZIP structure as a fifth embodiment according to the present invention.

The resin-encapsulated semiconductor device 10 using the ZIP structure in the fifth embodiment is constituted, as shown in FIG. 21, substantially in the same way as the previous fourth embodiment.

In this modified embodiment, respective portions for inner lead 3A applied with the reference power supply voltage Vss and the operation power supply voltage Vcc are widened to support the semiconductor pellet 1 on these portions.

This structure has additional effects capable of reducing the movement of the semiconductor pellet 1 upon resin encapsulation and reducing the inductance of the inner leads 3A applied with the reference power supply voltage Vss and the operation power supply voltage Vcc, as well as the effect of the previous fourth embodiment.

Figure 22:
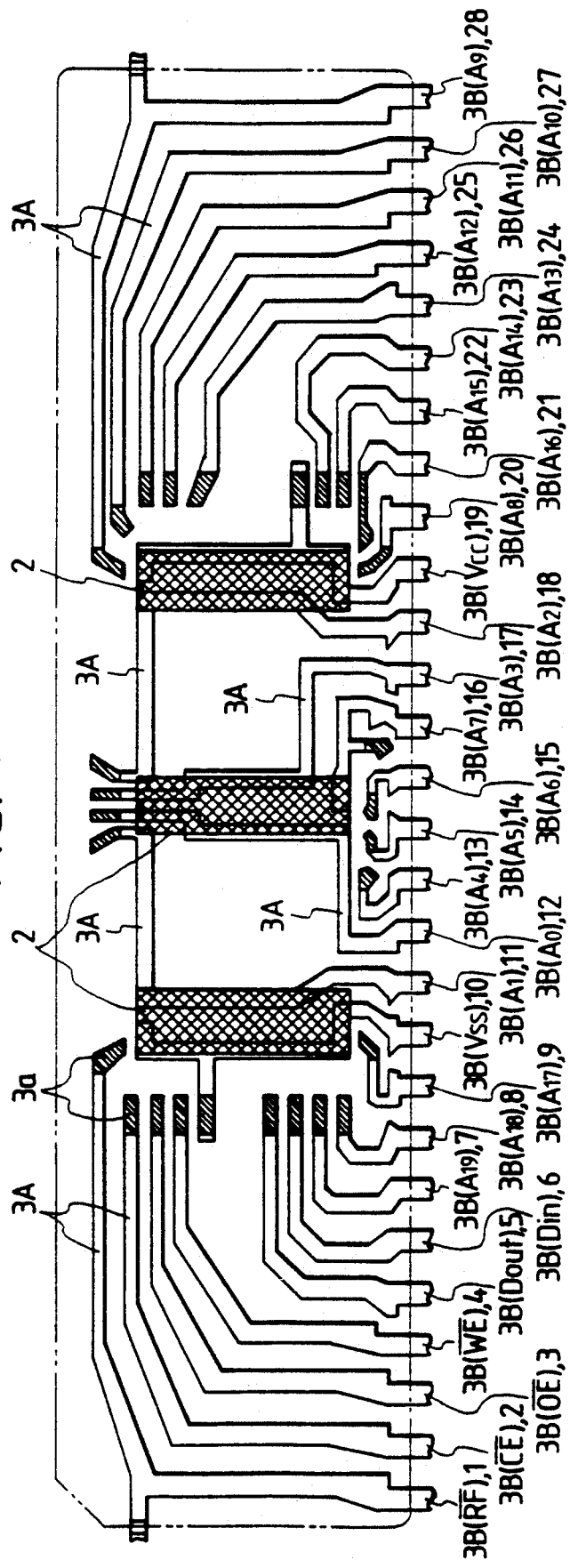
FIG. 22 is an outer view of a lead frame for a resin-encapsulated semiconductor device employing a ZIP structure as a sixth embodiment according to the present invention.
Figure 23:
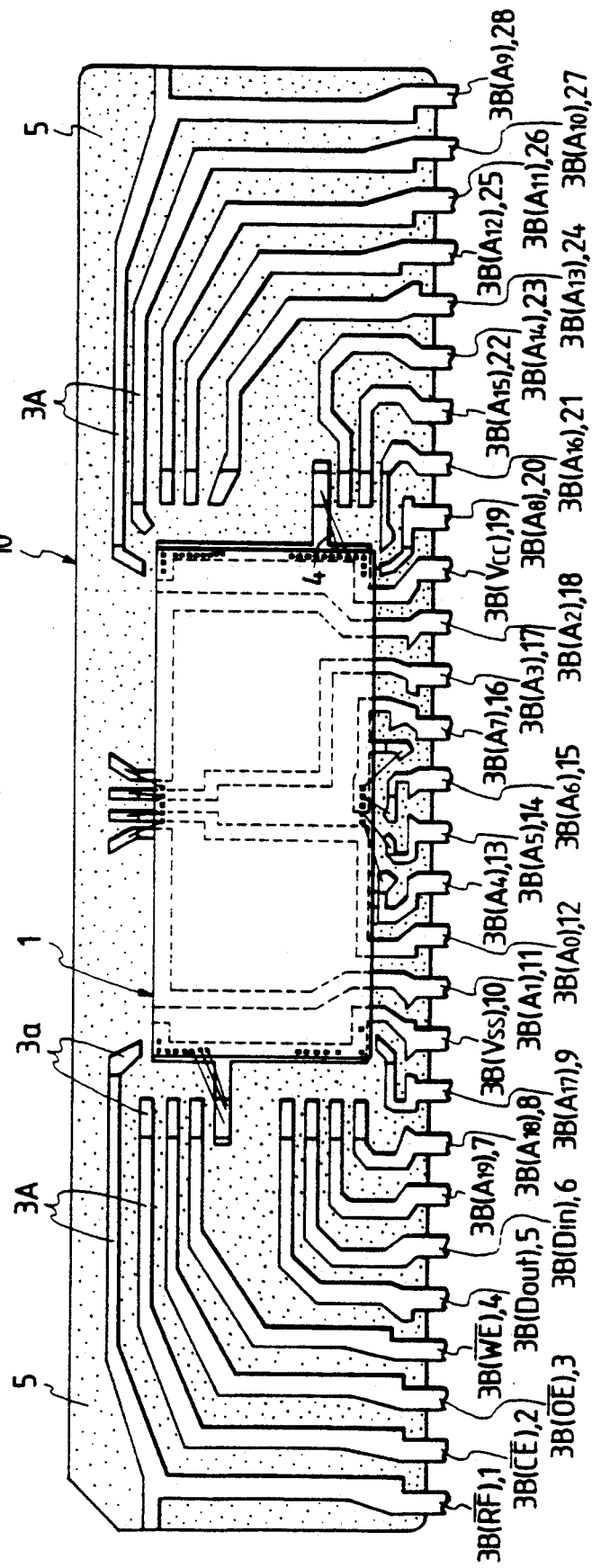
FIG. 23 is an enlarged cross-sectional view of the resin-encapsulated semiconductor device employing a ZIP structure of the sixth embodiment.

Description will be made to a sixth embodiment for the resin-encapsulated semiconductor device using the ZIP structure of the previous embodiment in which the shape of the insulation film 2 is changed. FIG. 22 shows the resin-encapsulated semiconductor device using the ZIP structure of the sixth embodiment in a state in which an insulation film is adhered to the lead frame. Further, FIG. 23 shows the structure of the resin-encapsulated semiconductor device of the ZIP structure in the sixth embodiment. In FIG. 23, the insulation film is not shown.

The feature of the sixth embodiment is that the insulation film 2 is divided into three portions, so that the size of the insulation film 2 is reduced as much as possible. The insulation film 2 includes water content. When vapor reflow is conducted upon mounting the resin-encapsulated semiconductor device on a mounting substrate by means of soldering, water content discharged from the insulation film 2 may sometimes expand to cause cracks in the resin-encapsulated semiconductor device. Accordingly, it is desirable in view of the moisture proofness that the area of the insulation film 2 is as small as possible.

In this sixth embodiment insulation films 2 are situated at positions corresponding to the upper, middle and lower peripheral circuits 19, 20 and 21 of the semiconductor pellet 1. As shown in FIG. 22, inner leads 3A for power supply are disposed along the shorter sides of the semiconductor pellet 1, and the inner leads 3A for address signals $A_1$, $A_2$ have such shape as having a portion closer to and in parallel with the inner leads 3A for the power supply. Further, inner leads for the address signals $A_0$, $A_3$ have such a shape as to be in parallel with each other at positions corresponding to the central area of the semiconductor pellet 1. The inner leads 3A for power supply and the inner leads 3A for the address signals $A_0$, $A_1$, $A_2$, $A_3$ have such a shape as providing the insulation films 2 with tension.

In the case of the structure for the inner leads 3A shown in FIG. 22, the order of the bonding pads for the address signals $A_0$, $A_1$ and $A_2$, $A_3$ of the semiconductor pellet 1 and the order of the inner leads 3A are opposite to those shown in FIGS. 15 to 21. In this modified embodiment, as shown in FIG. 23, the bonding pad for the address signals $A_0$, $A_1$ are connected with the inner leads 3A for the address signals $A_1$, $A_0$. Further, the bonding pads for the address signals $A_2$, $A_3$ are connected with the inner leads 3A for the address signals $A_3$, $A_2$, because if the address signals $A_0$, $A_1$ or $A_2$, $A_3$ are exchanged with each other, there is no requirement of changing the signals inputted from the outside and there is no change at all for the selection of the word line.

The sixth embodiment has a further advantageous effect in that it is capable of improving the moisture proofness of the resin-encapsulated semiconductor device 10 in addition to the effect obtained by the previous embodiments.

Next, a seventh embodiment according to the present invention will be described referring to FIG. 24, in which the inner leads 3A are disposed on a circuit-forming surface of the semiconductor pellet 1.

Figure 24:
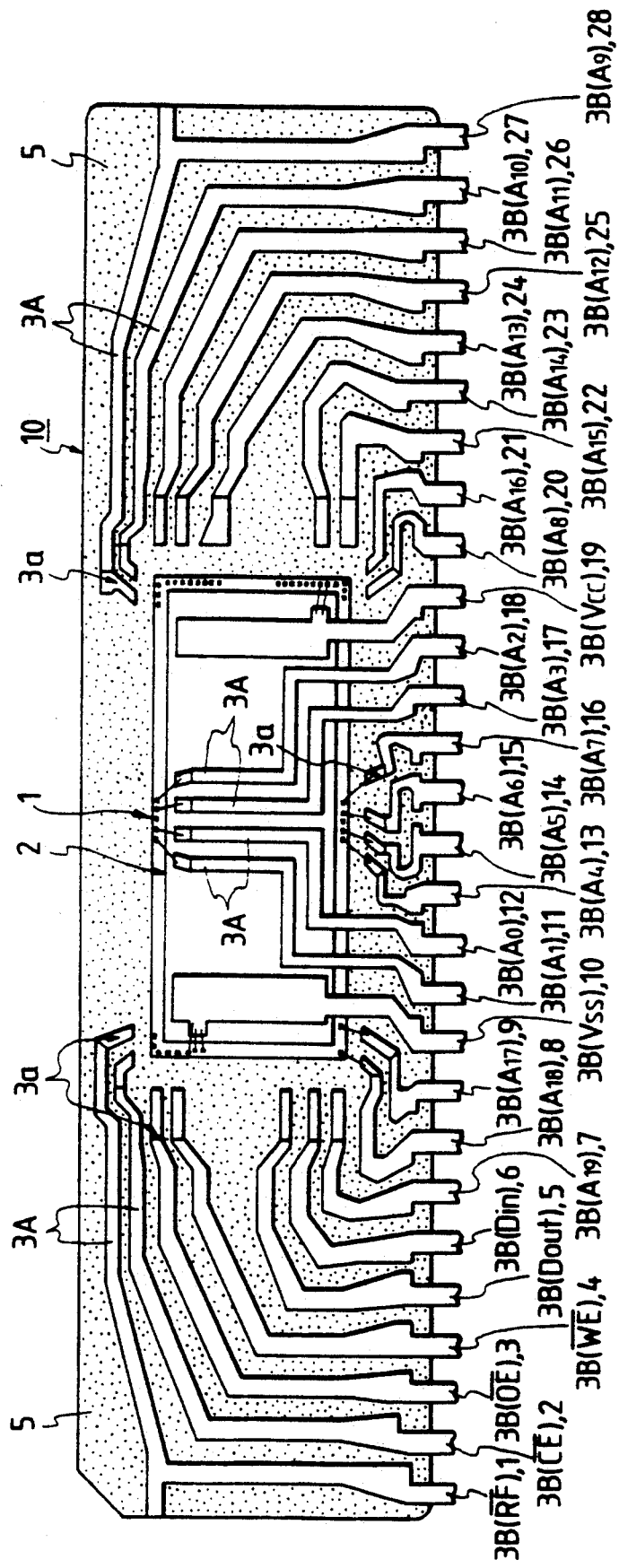
FIG. 24 is an enlarged cross-sectional view of the resin-encapsulated semiconductor device employing a ZIP structure of the seventh modified embodiment.

As shown in FIG. 24, an insulation film 2 is adhered on the circuit-forming surface of the semiconductor pellet 1 and, further, inner leads 3A are disposed on the insulation film 2.

Inner leads 3A for power supply are bonded to positions corresponding to the upper and the lower peripheral circuits 19, 21 of the semiconductor pellet 1. Inner leads 3A for address signals $A_0$–$A_3$ are extended on the circuit-forming surface of the semiconductor pellet 1 and terminated near the bonding pads for the address signals $A_0$–$A_3$ of the semiconductor pellet 1.

Further, the inner leads 3A for address signals $A_0$–$A_3$ and the bonding pads have a similar relationship as described for the sixth embodiment.

The seventh embodiment can provide the similar effect obtained in the previous embodiments.

The invention made by the present inventor has been described specifically referring to the previous embodiments, but the invention is not restricted only to the foregoing embodiments but various modifications are of course possible within a range not departing the spirit and scope of the invention.

For instance, in accordance with the present invention, other memory devices such as SRAMs or ROMs may be mounted on the resin-encapsulated semiconductor device 10 using a ZIP structure.

Further, a DRAM with a greater capacity of 4 Mbit or larger may be mounted on the semiconductor pellet 1 in the resin-encapsulated semiconductor device using a ZIP structure in the previous embodiments.

The advantageous effects obtained by typical examples disclosed in the present patent application will be summarized below.

In a resin-encapsulated semiconductor device using a Single In-line Package structure, the size can be reduced.

Further, the yield can be improved together with the size reduction in the resin-encapsulated semiconductor device.

Further, electric reliability can be improved in the resin-encapsulated semiconductor device.

Further, the operation speed can be improved in the resin-encapsulated semiconductor device.

Further, the heat resistance can be reduced in the resin-encapsulated semiconductor device.

We claim:

1. A semiconductor device comprising:
   a semiconductor pellet having a rectangular main surface on which two memory cell arrays and a peripheral circuit including a row address decoder circuit are formed, wherein said two memory cell arrays are arranged in line along longer sides of said rectangular main surface, and said peripheral circuit is arranged between said two memory cell arrays;
   a plurality of first bonding pads disposed between said two memory cell arrays and electrically connected with said row address decoder circuit which is located adjacently to said first bonding pads, and a plurality of second bonding pads disposed on said rectangular main surface;
   a body comprised of resin and having a surface substantially vertical to the rectangular main surface of said semiconductor pellet;
   a plurality of leads protruding out of said body only from said surface substantially vertical to the rectangular main surface of said semiconductor pellet, and extending in said body and having ends situated near said first and second bonding pads; and
   means for electrically connecting said first and second bonding pads with said ends of said leads, wherein at least one of leads electrically connected to said first bonding pads is located across one of said longer sides of said rectangular semiconductor pellet.

2. A semiconductor device as defined in claim 1, wherein said memory cell arrays each comprise a plurality of word lines extended in a row direction of said memory cell arrays, a plurality of data lines extended in columns, and a plurality of memory cells each respectively disposed at intersections between the word lines and the data lines, said word lines being connected with said row address decoder circuit.

3. A semiconductor device as defined in claim 2, wherein each of the memory cells comprises a MISFET and a capacitive element connected in series with each other.

4. A semiconductor device as defined in claim 1, wherein the lateral width for the portion of said at least one lead connected to said first bonding pads is smaller than the lateral width of leads connected to the second bonding pad.

5. A semiconductor device as defined in claim 1, wherein said at least one lead connected to said first bonding pad is extended across the other longer side on said rectangular main surface.

6. A semiconductor device as defined in claim 1, wherein the end of said at least one lead connected to said first bonding pad is situated on the rectangular main surface of said semiconductor pellet.

7. A semiconductor device as defined in claim 1, further comprising further memory cell arrays arranged in line with each of said two memory cell arrays along said shorter sides of said rectangular main surface.

8. A semiconductor device as defined in claim 7, wherein said first bonding pads are situated between said two memory cell arrays and are electrically connected to said row address decoder.

9. A semiconductor device as defined in claim 8, wherein said two memory cell arrays and said further memory cell arrays each comprise a plurality of word lines extended in a row direction, a plurality of data lines extended in a column direction, and a plurality of memory cells each respectively disposed at intersections between the word lines and the data lines, said word lines being connected with said row address decoder circuit.

10. A semiconductor device as defined in claim 9, wherein said peripheral circuit comprises n-channel and p-channel MISFETs and bipolar transistors.

11. A semiconductor device as defined in claim 10, wherein said first bonding pads include terminals to which signals for selecting a predetermined word line are input, and said second bonding pads include terminals to which signals for selecting a predetermined data line are input.

* * * * *